United States Patent
Jordanov

(10) Patent No.: US 6,844,791 B2
(45) Date of Patent: Jan. 18, 2005

(54) DIGITAL PULSE SHAPER WITH VARIABLE WEIGHTING FUNCTION

(75) Inventor: Valentin T. Jordanov, Durham, NH (US)

(73) Assignee: Canberra Industries, Inc., Meriden, CT (US)

(*) Notice: Subject to any disclaimer, the term of this patent is extended or adjusted under 35 U.S.C. 154(b) by 90 days.

(21) Appl. No.: 10/344,877
(22) PCT Filed: Aug. 16, 2001
(86) PCT No.: PCT/US01/25637
§ 371 (c)(1), (2), (4) Date: Feb. 14, 2003
(87) PCT Pub. No.: WO02/15396
PCT Pub. Date: Feb. 21, 2002

(65) Prior Publication Data
US 2004/0054704 A1 Mar. 18, 2004

(51) Int. Cl.[7] .............. H03K 3/00; H04B 3/04
(52) U.S. Cl. .............. 333/20; 307/106; 327/165
(58) Field of Search .............. 333/20; 307/106; 327/130, 165, 167

(56) References Cited

U.S. PATENT DOCUMENTS 4,283,788 A * 8/1981 Tamburelli .............. 375/232

* cited by examiner

Primary Examiner—Barbara Summons
(74) Attorney, Agent, or Firm—John H. Crozier

(57) ABSTRACT

A method of providing real time digital pulse shaping includes: receiving a digital pulse input signal (31); applying the digital pulse input signal to first (33, 34, 35) and second (32, 36, 37) processing channels, the first processing channel including a CONCAVE shaper (34) and the second processing channel including a CONVEX shaper (36); applying selected digital control parameters to the CONCAVE shaper (34) and the CONVEX shaper (36) to produce desired first and second weigthing functions, and superposing the first and second weighting functions to produce a desired overall weighting function.

1 Claim, 21 Drawing Sheets

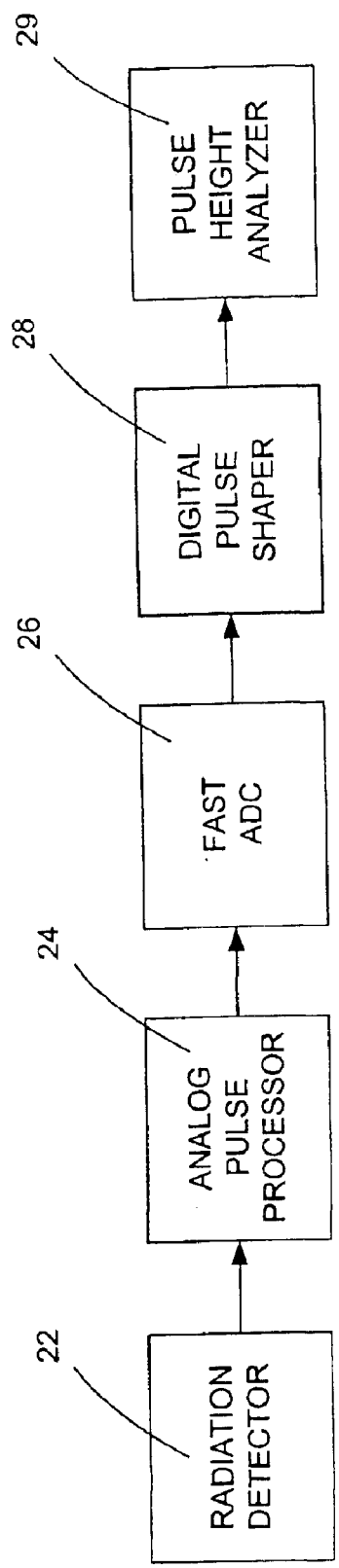
Fig. 1 Typical block diagram of radiation spectrometer with real time digital shaper.
(Prior Art)

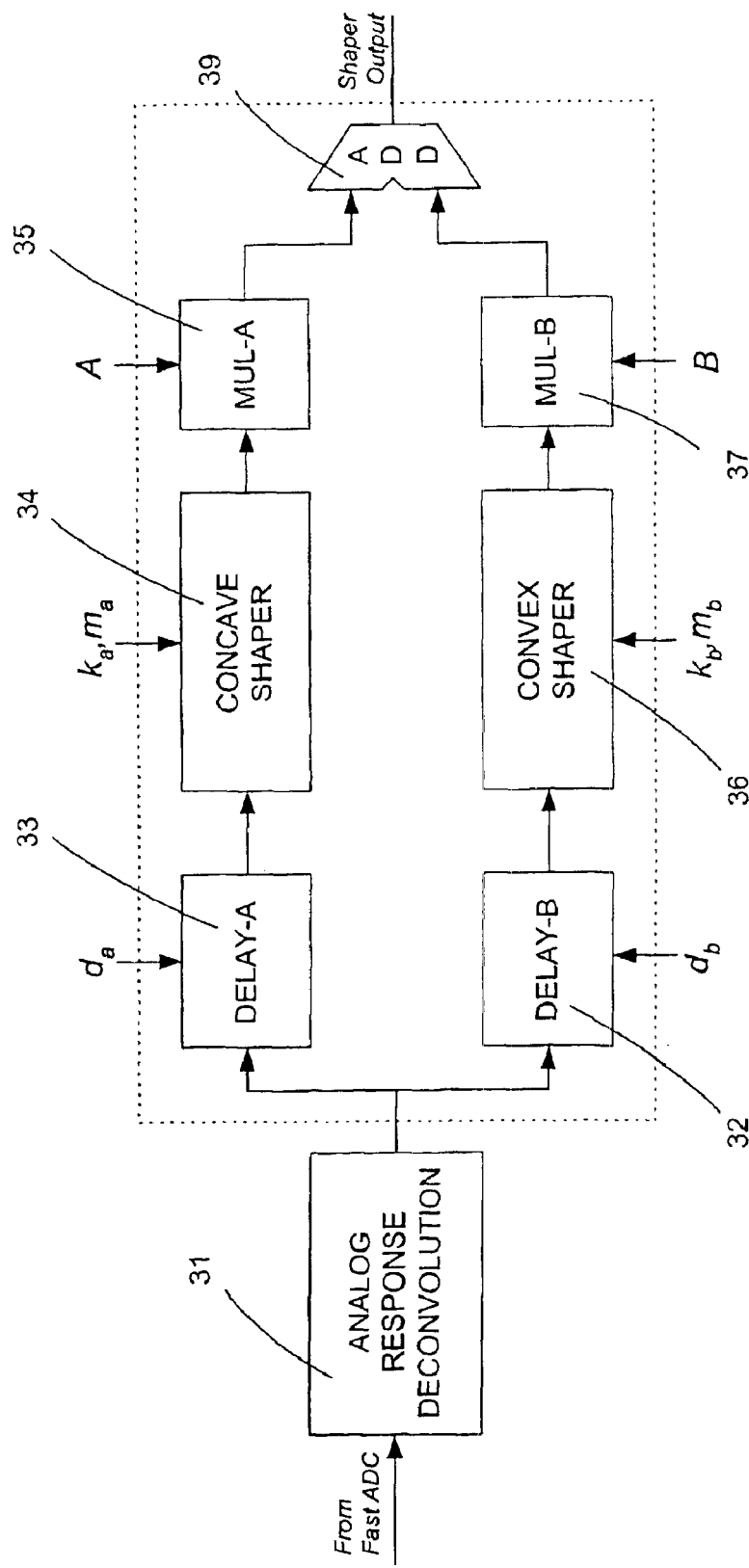
Fig. 2 Block diagram of the digital pulse shaper with variable WF.

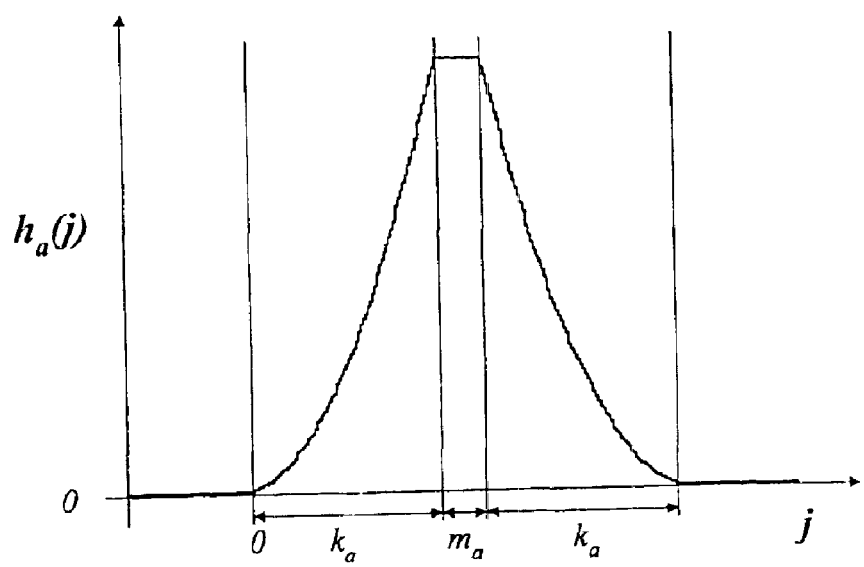
Fig. 3. Unit impulse responses of the CONCAVE shaper.
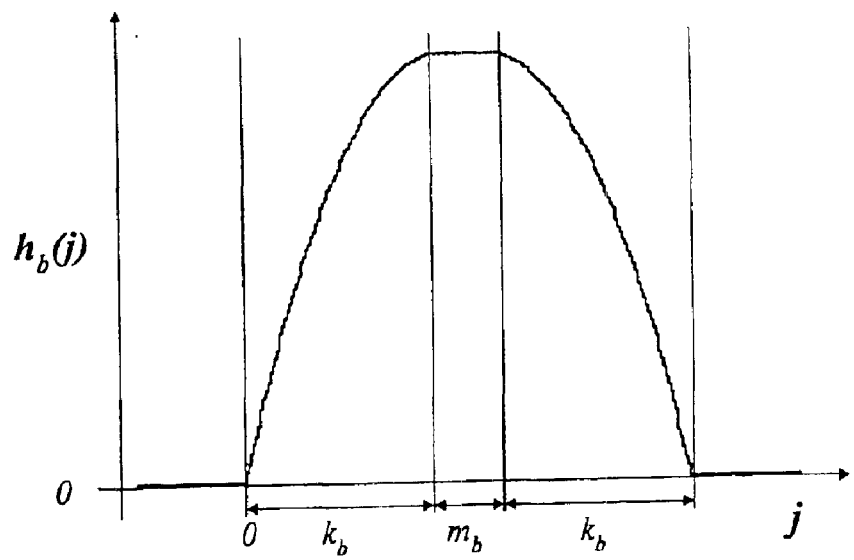
Fig. 4. Unit impulse responses of the CONVEX shaper.

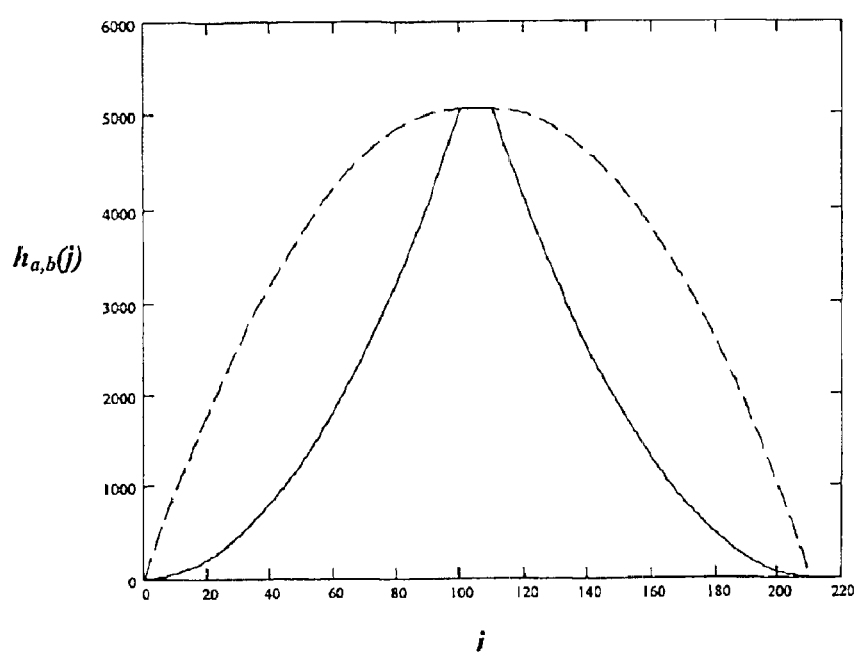
Fig. 5 Unit impulse responses $h_a(j)$ and $h_b(j)$. Rise time, fall time and flat top are set to: $k_a = k_b = 100$, $m_a = m_b = 10$.

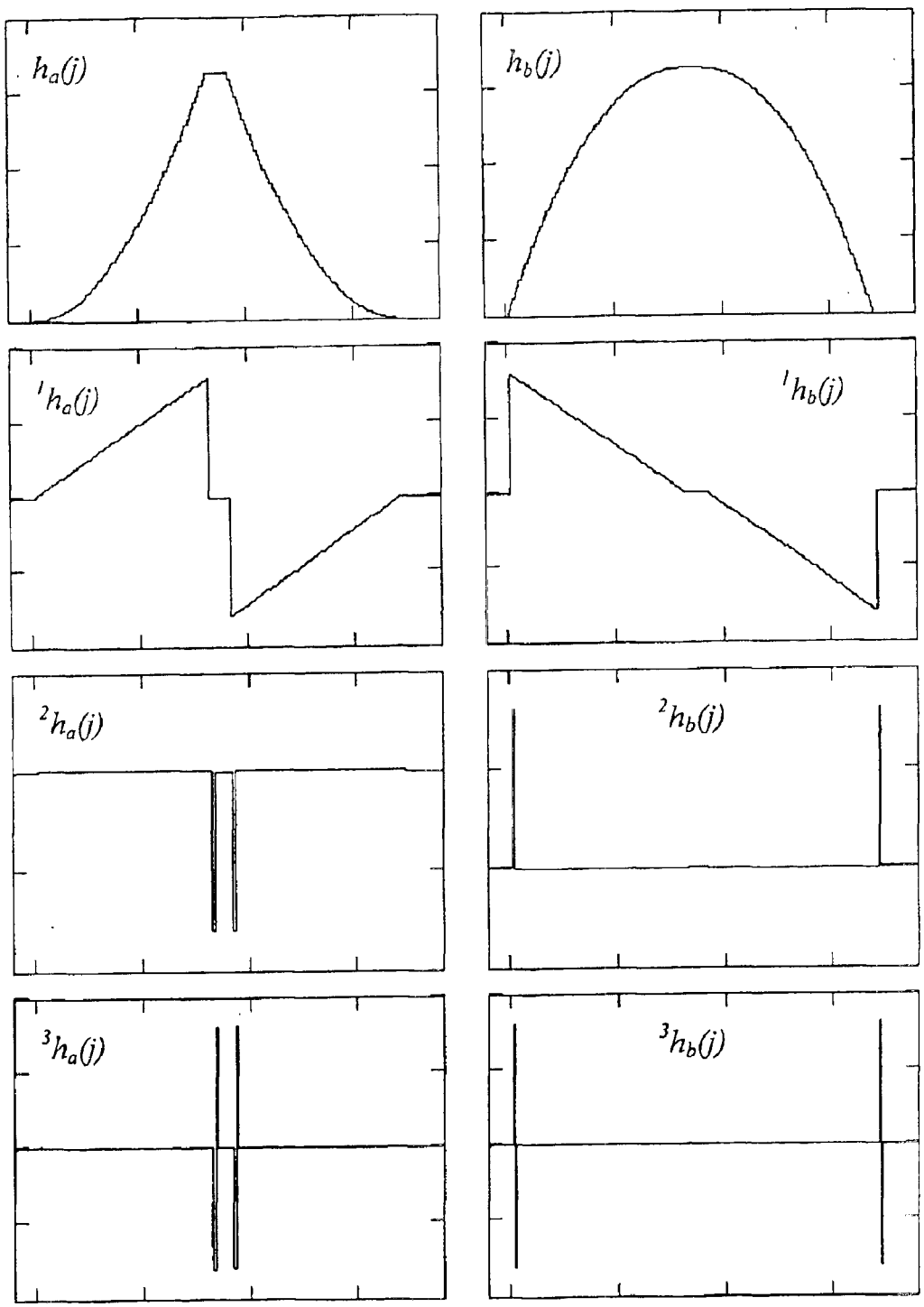
Fig. 6 Unit impulse responses $h_a(j)$ and $h_b(j)$, and their first, second and third derivatives.

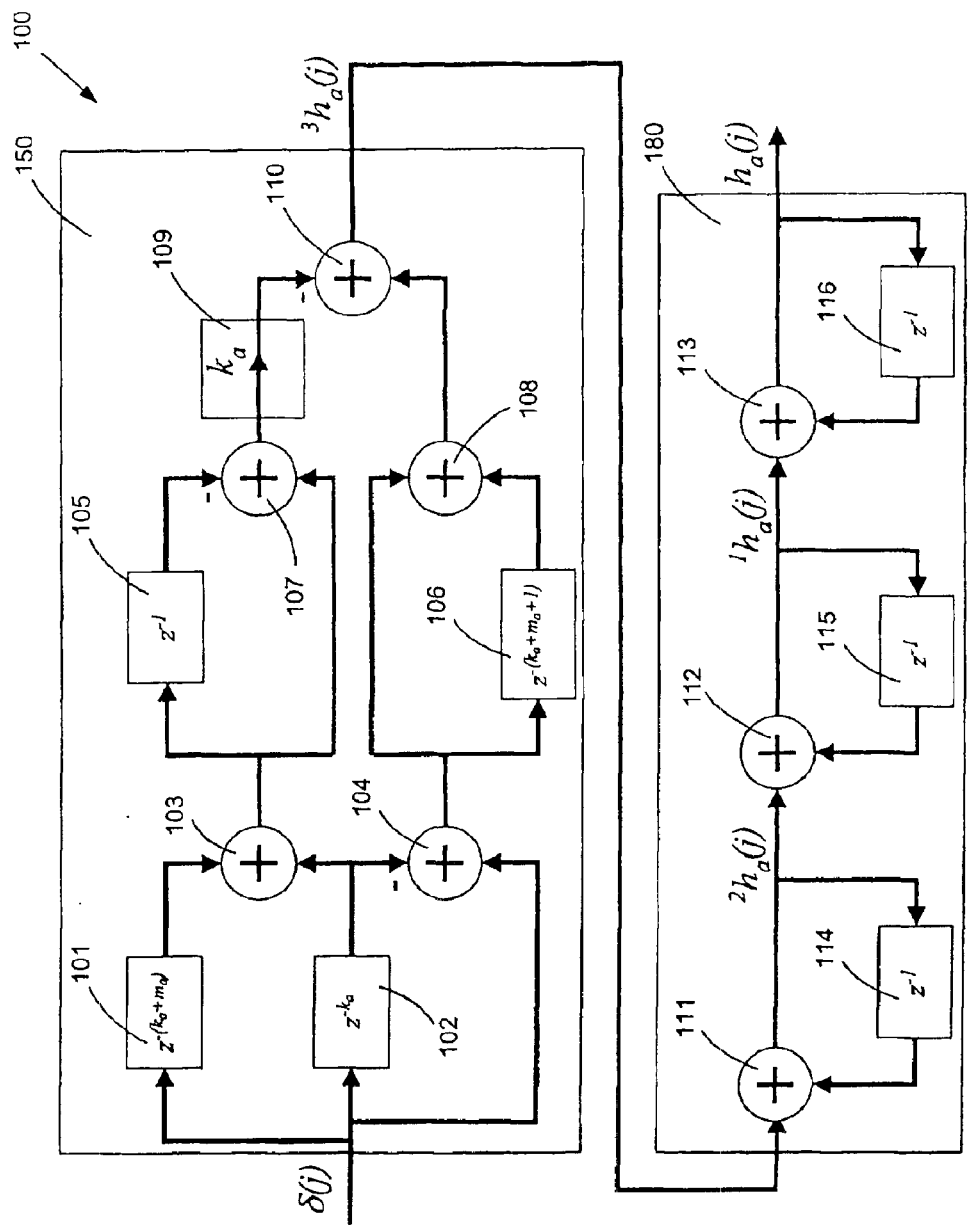
Fig. 7 Block diagram realization of the CONCAVE shaper.

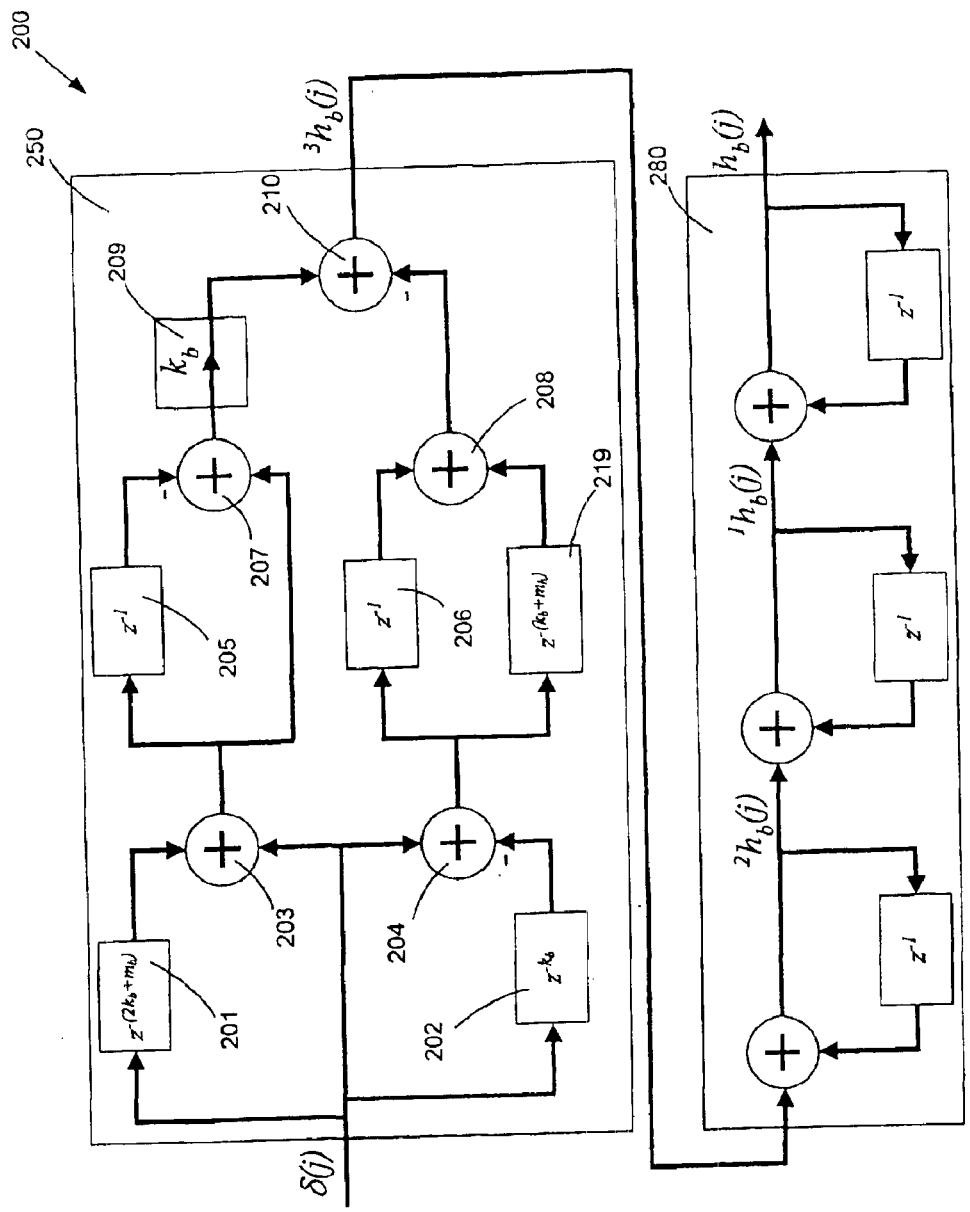
Fig. 8 Block diagram realization of the CONVEX shaper.

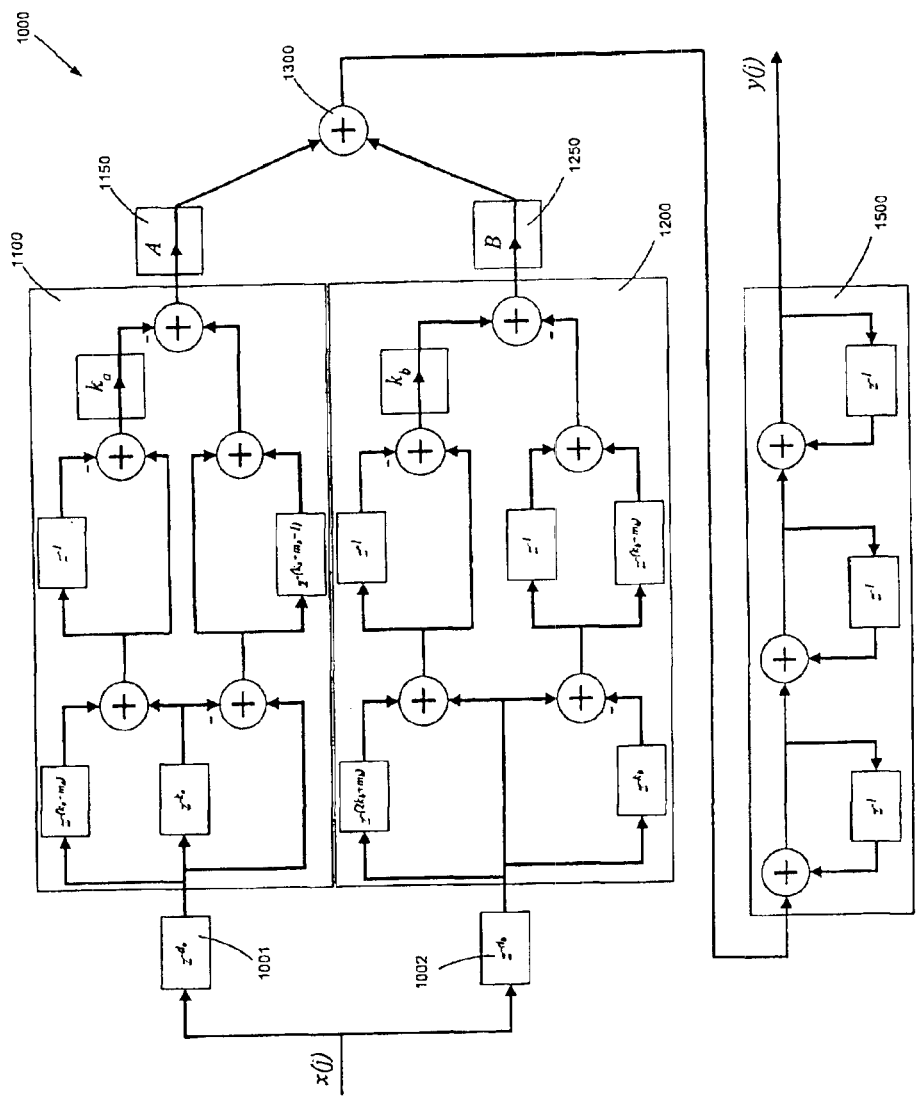
Fig. 9 Block diagram realization of the real time digital shaper with variable WF.

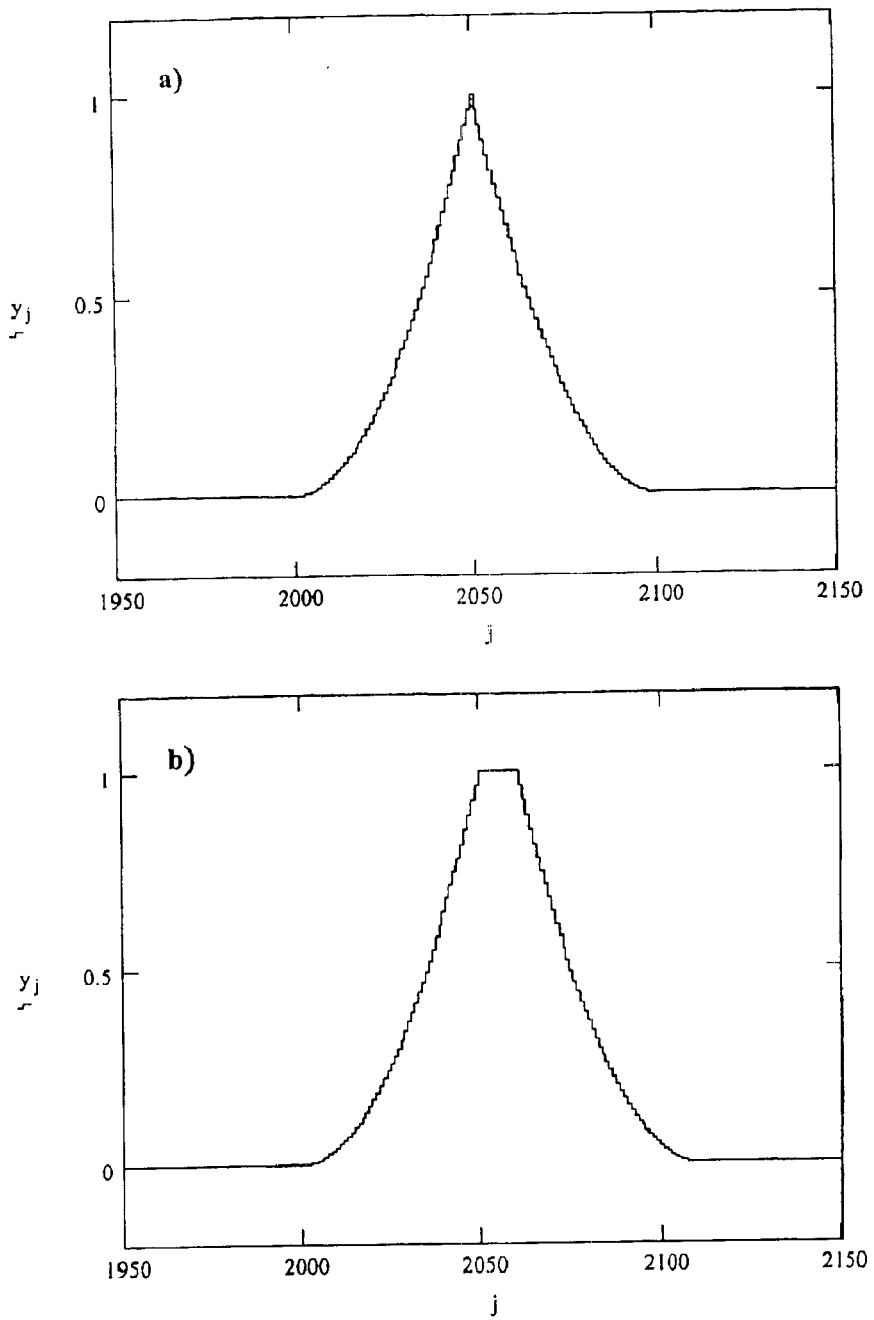
Fig. 10. Response of the real time digital pulse shaper with variable WF. WF control parameters are set as follows: a) $k_a=0$, $m_a=0$, $k_b=xx$, $m_b=xx$, $A=1$, $B=0$, $d_a=0$, $d_b=0$; b) $k_a=0$, $m_a=10$, $k_b=xx$, $m_b=xx$, $A=1$, $B=0$, $d_a=0$, $d_b=0$.

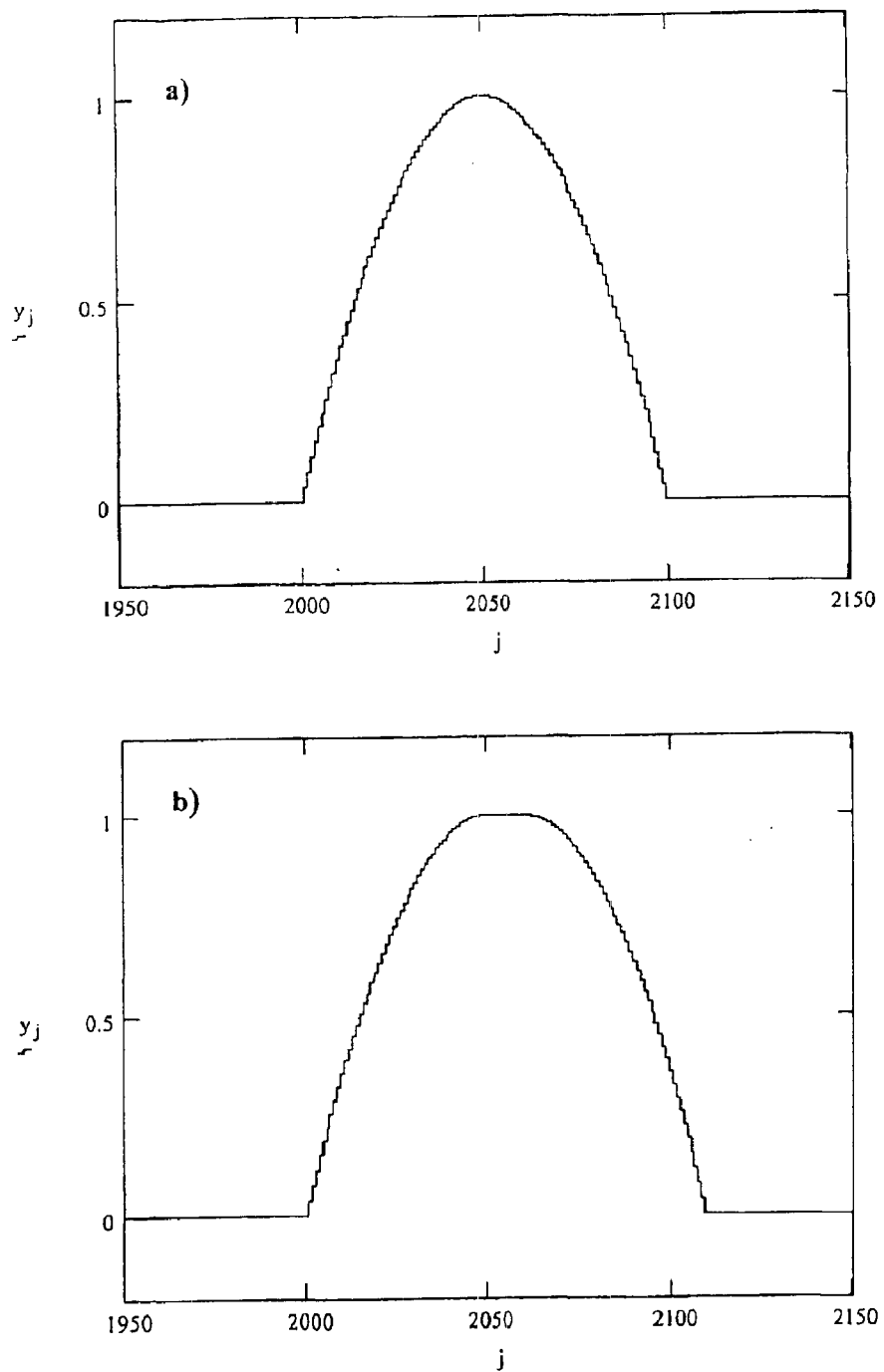
Fig. 11. Response of the real time digital pulse shaper with variable WF. WF control parameters are set as follows: a) $k_a=xx$, $m_a=xx$, $k_b=50$, $m_b=0$, $A=0$, $B=1$, $d_a=0$, $d_b=0$; b) $k_a=xx$, $m_a=xx$, $k_b=50$, $m_b=10$, $A=1$, $B=0$, $d_a=0$, $d_b=0$.

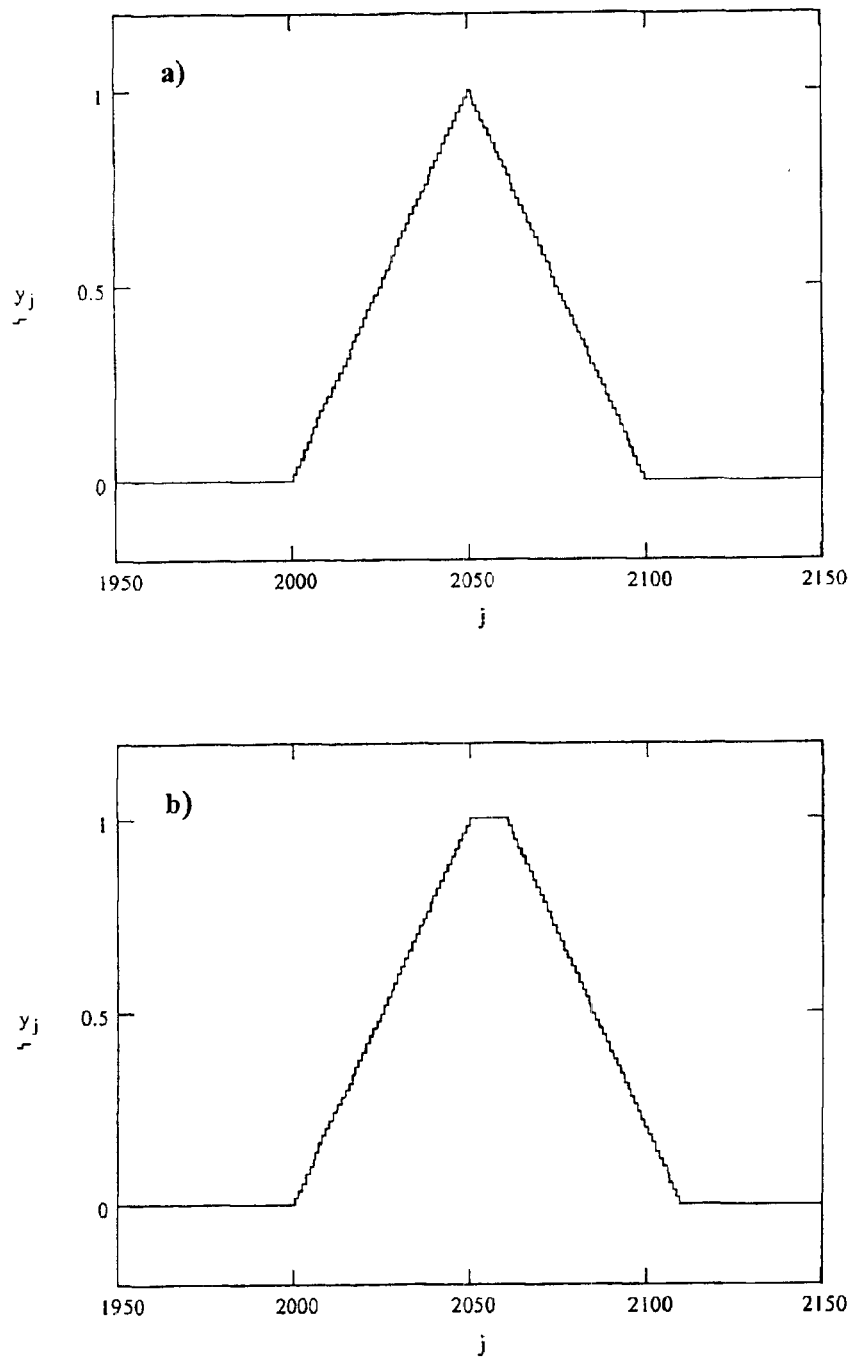
Fig. 12. Response of the real time digital pulse shaper with variable WF. WF control parameters are set as follows: a) $k_a=50$, $m_a=0$, $k_b=50$, $m_b=0$, $A=1$, $B=1$, $d_a=0$, $d_b=0$; b) $k_a=50$, $m_a=0$, $k_b=50$, $m_b=10$, $A=1$, $B=1$, $d_a=0$, $d_b=0$. These are triangular/trapezoidal weighting functions that are optimal when 1/f noise contribution is insignificant.

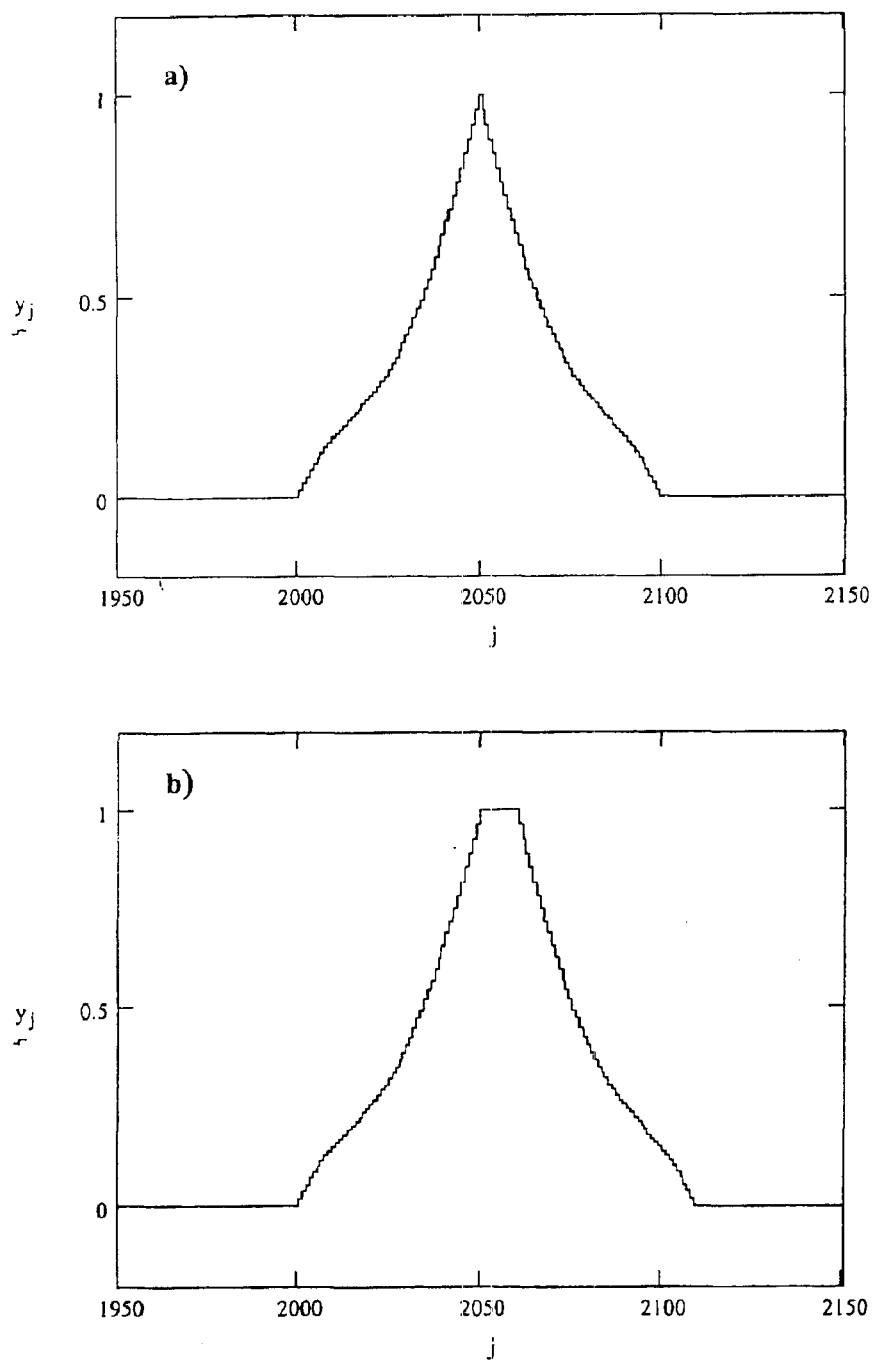
Fig. 13. Response of the real time digital pulse shaper with variable WF. WF control parameters are set as follows: a) $k_a=40$, $m_a=0$, $k_b=20$, $m_b=60$, $A=1$, $B=1$, $d_a=10$, $d_b=0$; b) $k_a=40$, $m_a=10$, $k_b=20$, $m_b=70$, $A=1$, $B=1$, $d_a=10$, $d_b=0$.

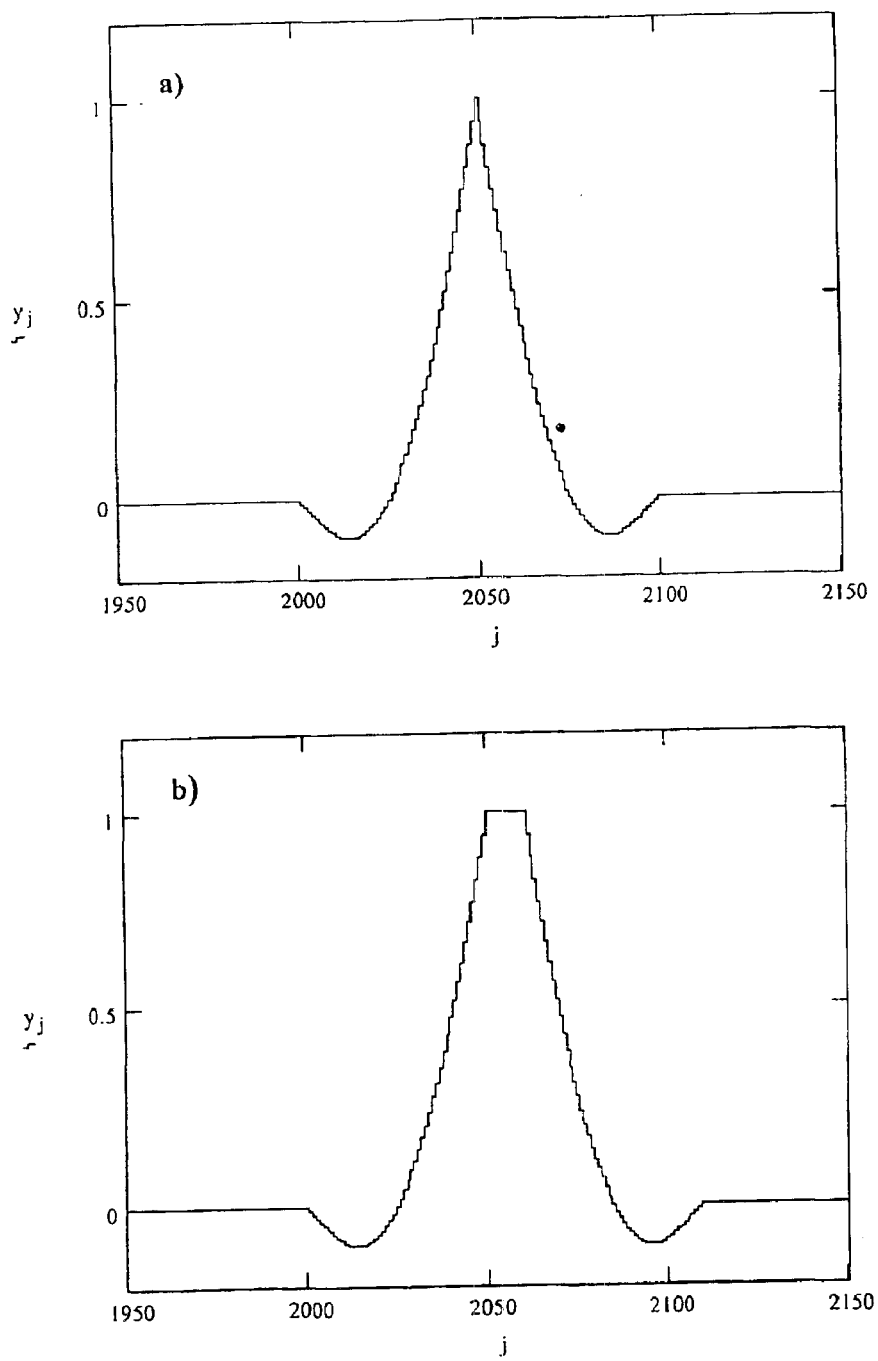
Fig. 14. Response of the real time digital pulse shaper with variable WF. WF control parameters are set as follows: a) $k_a=40$, $m_a=0$, $k_b=50$, $m_b=0$, $A=8$, $B=-1$, $d_a=10$, $d_b=0$; b) $k_a=40$, $m_a=10$, $k_b=50$, $m_b=10$, $A=8$, $B=-1$, $d_a=10$, $d_b=0$.

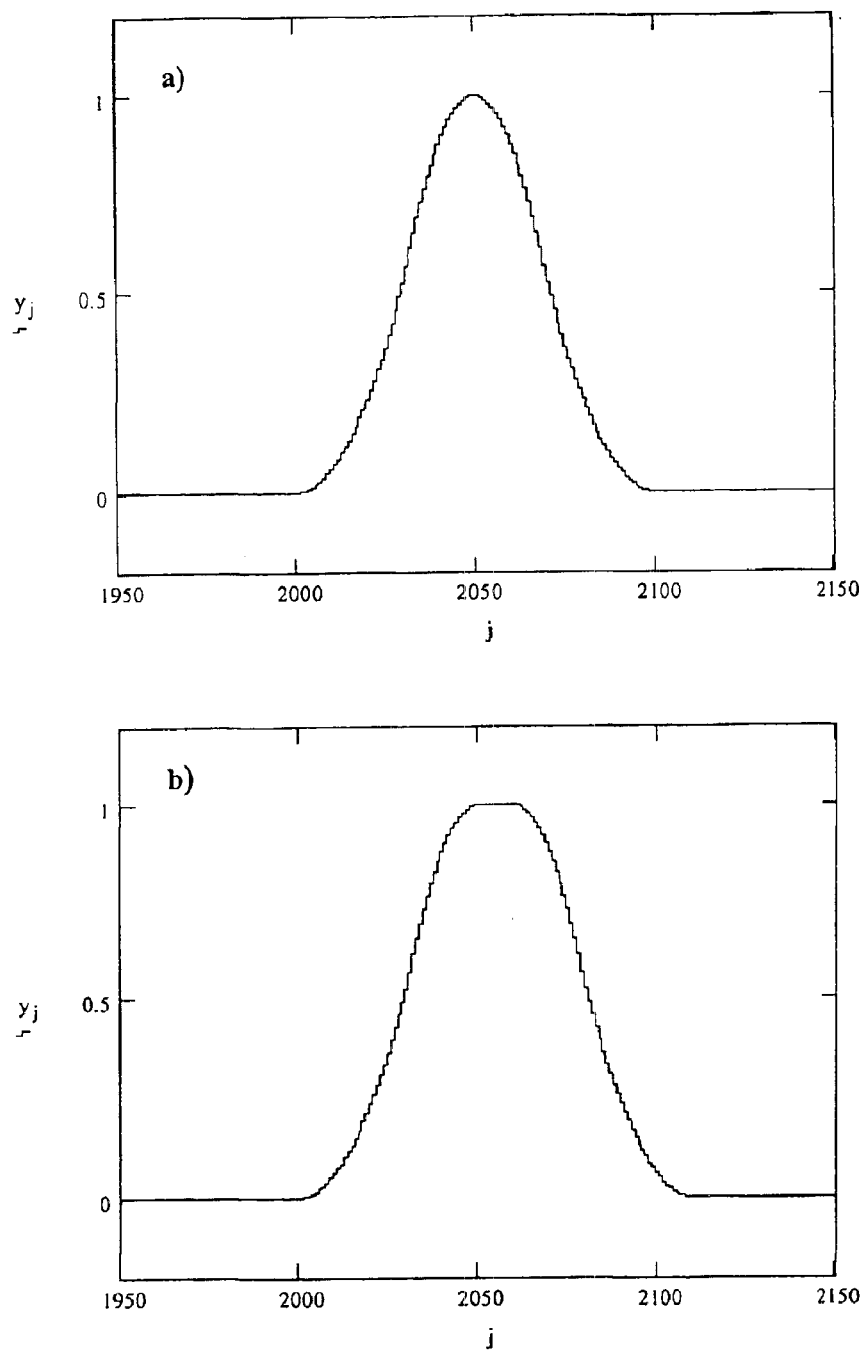
Fig. 15. Response of the real time digital pulse shaper with variable WF. WF control parameters are set as follows: a) $k_a=30$, $m_a=40$, $k_b=20$, $m_b=0$, $A=1$, $B=2$, $d_a=0$, $d_b=30$; b) $k_a=30$, $m_a=50$, $k_b20$, $m_b=10$, $A=1$, $B=2$, $d_a=0$, $d_b=30$.

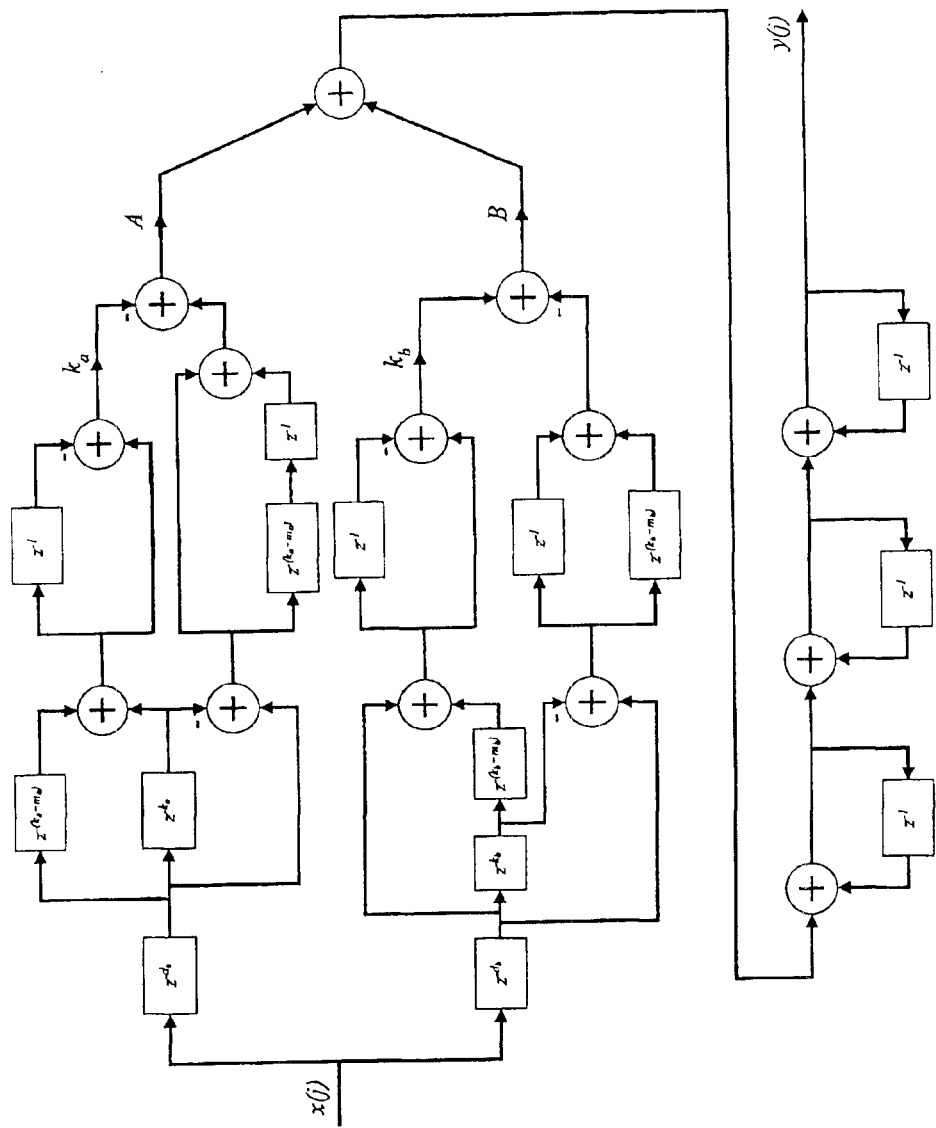
Fig. 16 Block diagram realization of the real time digital shaper using only three types of delay lines: $-z^{-k}$, $z^{-(k+m)}$, and $z^{-1}$.

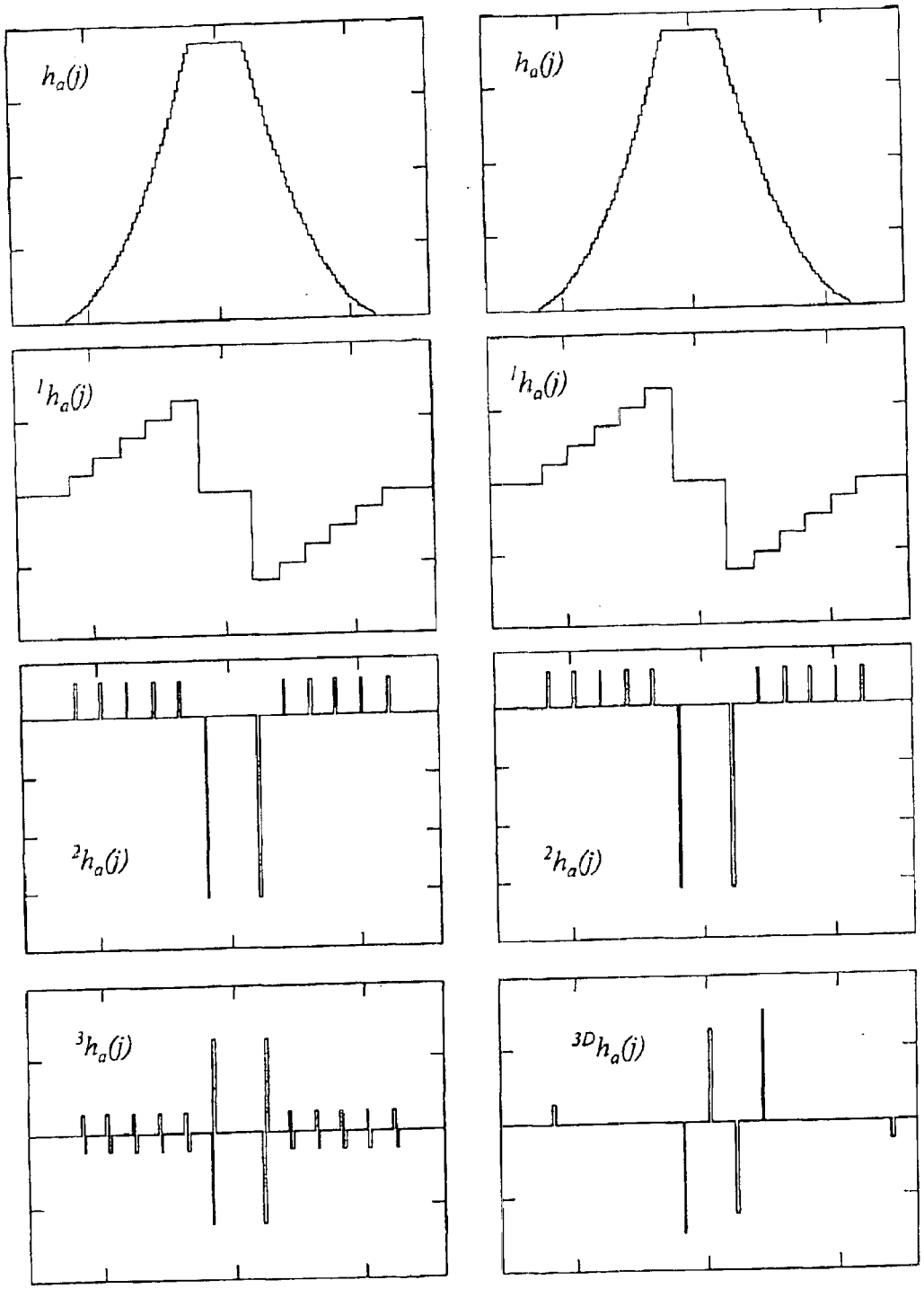
Fig. 17 Unit impulse response of the CONCAVE shaper and the associated derivatives.

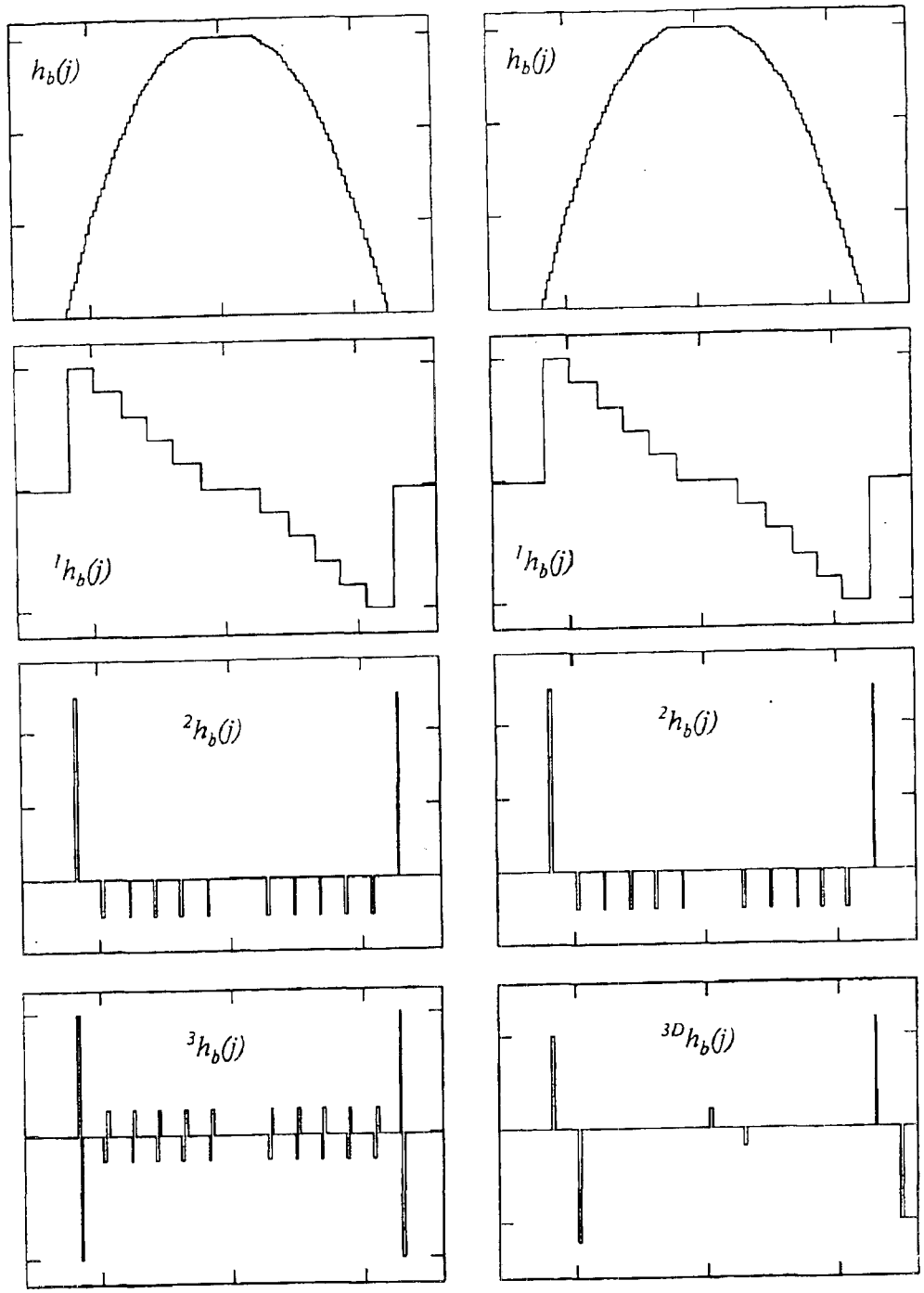
Fig. 18 Unit impulse response of the CONVEX shaper and the associated derivatives.

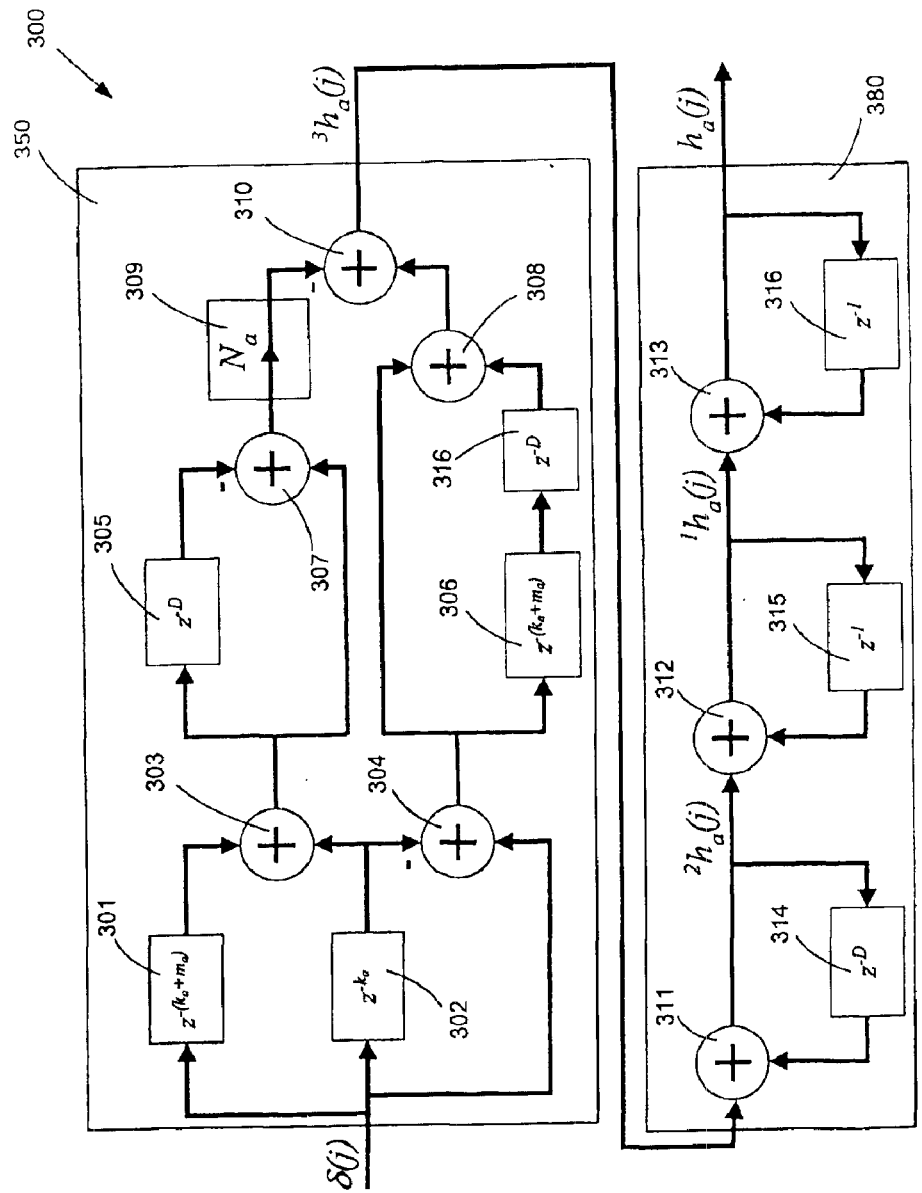
Fig. 19 Block diagram realization of the CONCAVE shaper using linear interpolation.

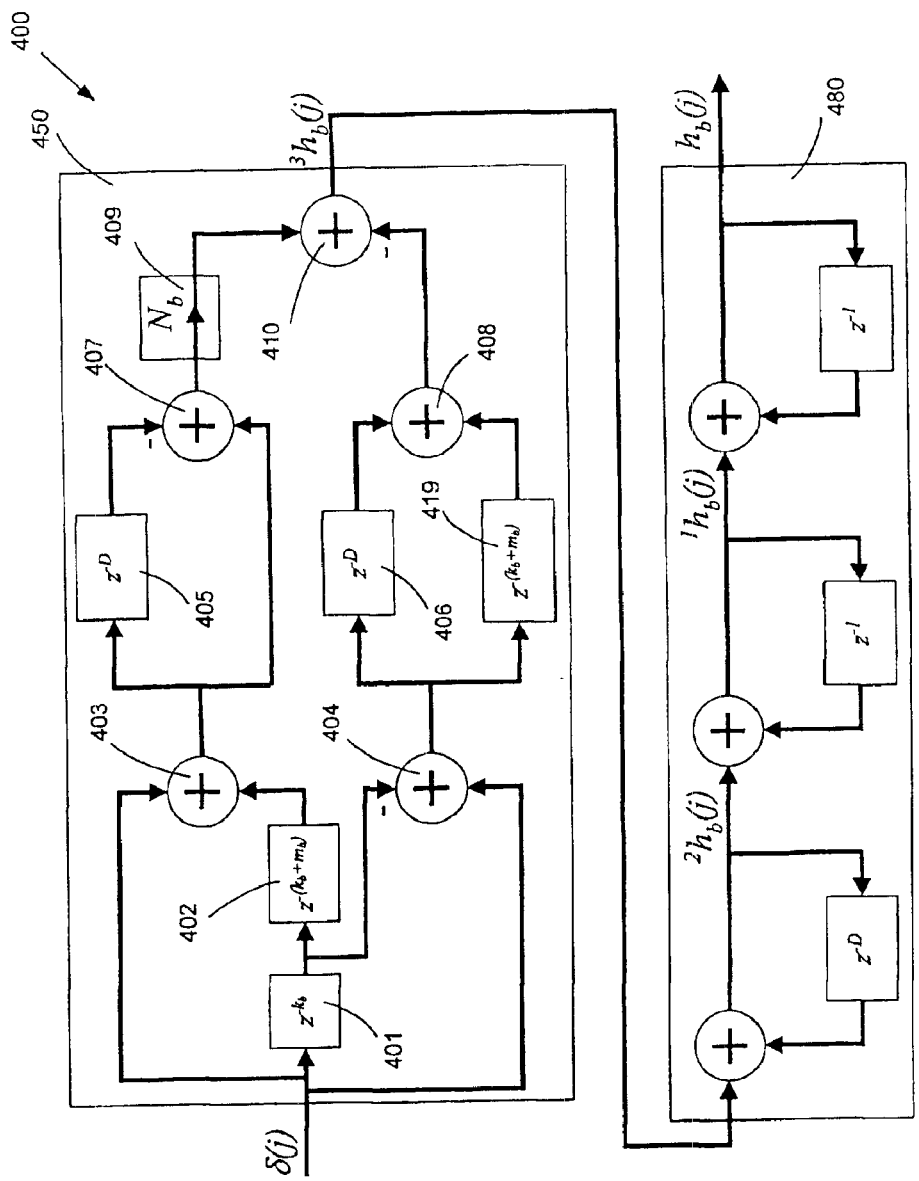
Fig. 20 Block diagram realization of the CONVEX shaper using linear interpolation.

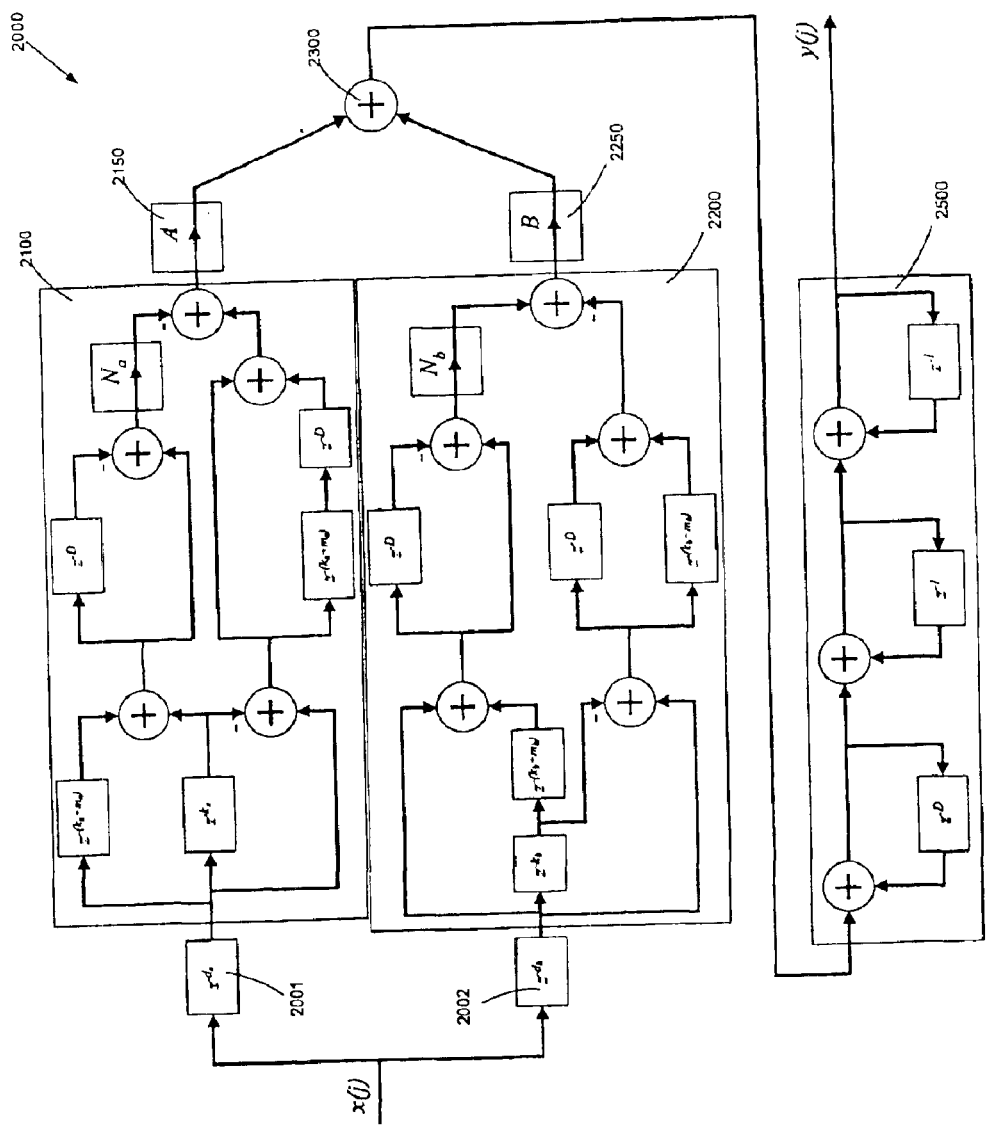
Fig. 21 Block diagram realization of the real time digital shaper with variable WF and linear interpolation.

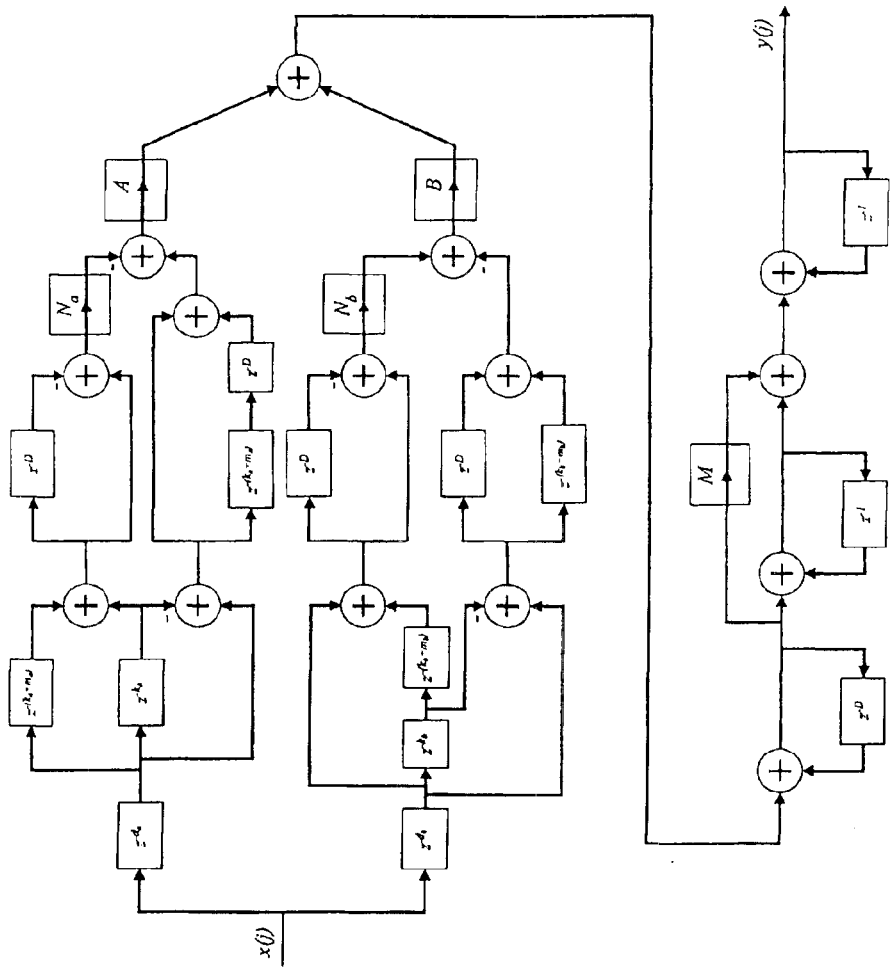
Fig. 22 Block diagram realization of the real time digital shaper with variable WF. The discrete input signal $x(j)$ represents sampled exponential signal with time constant $\tau$. The coefficient $M$ is a function of $\tau$ and the sampling period $T_{clk}$.

DIGITAL PULSE SHAPER WITH VARIABLE WEIGHTING FUNCTION

TECHNICAL FIELD

The present invention relates to digital pulse shapers generally and, more particularly to a real time digital pulse shaper with variable weighting function.

BACKGROUND ART

Real time digital pulse shaping techniques allow synthesis of pulse shapes that have been difficult to realize using the traditional analog methods. Using real time digital shapers, triangular/trapezoidal filters can be synthesized in real time, as described in V. T. Jordanov et al., *Nucl. Instr. and Meth.*, A353, pg. 261 (1994), or in quasi real time, as described in G. Ripamonti et al., *Nucl. Instr. and Meth.*, A340, pg. 584 (1994). These filters exhibit digital control on the rise time, fall time, and flattop of the trapezoidal shape. Thus, the trapezoidal shape can be adjusted for optimum performance at different distributions of the series and parallel noise.

The trapezoidal weighting function (WF) represents the optimum time-limited pulse shape when only parallel and series noises are present in the detector system. See, V. Radeka, *IEEE Trans. Nucl. Sci.*, NS-15, pg. 455 (1968); F. S. Goulding, *Nucl. Instr. and Meth.*, A100, pg. 493 (1972); and E. Gatti and M. Sampeitro, *Nucl. Instr. and Meth.*, A287, pg 513 (1990). In the presence of 1/f noise, the optimum WF changes depending on the 1/f noise contribution. Optimum pulse shapes have been derived, as described in E. Gatti and M Sampietro, ibid., and E. Gatti, et al., *Nucl. Instr. and Meth.*, A394, pg. 268 (1997), for both cases of 1/f voltage and 1/f current noise sources. These shapes can be synthesized using intensive off-line computational techniques that reduce significantly the throughput of the spectroscopy system.

Accordingly, it is a principal object of the invention to provide a method of real time digital pulse shaping with variable weighting function.

It is a further object of the invention to provide such a method that can be used for both cases of 1/f voltage and 1/f current noise sources.

Other objects of the invention, as well as particular features and advantages thereof, will be apparent or be elucidated in the following description and the accompanying drawing figures.

DISCLOSURE OF INVENTION

The present invention achieves the above objects, among others, by providing, in a preferred embodiment, a method of providing real time digital pulse shaping, comprising: receiving a digital pulse input signal; applying said digital pulse input signal to first and second processing channels, said first processing channel including a CONCAVE shaper and said second processing channel including a CONVEX shaper; applying selected digital control parameters to said CONCAVE shape and said CONVEX shaper to produce desired first and second weighting functions; and superposing said first and second weighting functions to produce a desired overall weighting function.

BRIEF DESCRIPTION OF DRAWINGS

Understanding of the present invention and the various aspects thereof will be facilitated by reference to the accompanying drawing figures, submitted for purposes of illustration only and not intended to define the scope of the invention, on which:

FIG. 1 is a block diagram of a radiation spectrometer that can employ the present invention.

FIG. 2 is a block diagram of a digital pulse shaper according to the present invention, with variable weighting function.

FIG. 3 shows the unit impulse responses of the CONCAVE shaper.

FIG. 4 shows the unit impulse responses of the CONVEX shaper.

FIG. 5 combines the impulse responses of FIGS. 3 and 4.

FIG. 6 shows the impulse responses of FIGS. 3 and 4 and their first, second, and third derivatives.

FIG. 7 is a block diagram of the CONCAVE shaper.

FIG. 8 is a block diagram of the CONVEX shaper.

FIG. 9 is a block diagram of the real time shaper with variable weighting function.

FIGS. 10–15 shows responses of the real time digital pulse shaper with variable weighting function, with specified weighting function control parameters, with and without flattop that can be synthesized using CONCAVE and CONVEX shapers.

FIG. 16 is block diagram of the real time digital shaper using only three types of delay lines.

FIG. 17 shows unit responses of the CONCAVE shaper and associated derivatives.

FIG. 18 shows unit responses of the CONVEX shaper and associated derivatives.

FIG. 19 is a block diagram of the CONCAVE shaper using linear interpolation.

FIG. 20 is a block diagram of the CONVEX shaper using linear interpolation.

FIG. 21 is a block diagram of a real time digital shaper with variable weighting function and linear interpolation.

FIG. 22 is a block diagram of a real time digital shaper, where the discrete input signal represents a sampled exponential signal with a time constant.

BEST MODE FOR CARRYING OUT THE INVENTION

The present invention provides a real time digital pulse shaper that allows varying the weighting function of the shaper by means of digital control. Shapes can be synthesized that are optimum or near optimum when 1/f noise sources are present. The trapezoidal shape can be also obtained. The synthesized pulse shapes are symmetric with digitally controlled flattop and rise(fall) time.

Weighting Function Synthesis

Real time digital pulse shapers are used to process signals from radiation detectors. A typical block diagram of radiation spectrometer with real time digital shaper is shown in FIG. 1. The signal from radiation detector 22 passes through an analog pulse processor 24 that normally includes a charge sensitive preamplifier (not separately shown). Additional analog preprocessing functions such as low pass and high pass filters can be included in the analog pulse processor. It is important that the main components of the analog preprocessor response are known or can be determined experimentally. The analog signal is then digitized using a fast analog-to-digital converter (ADC) 26. The digital samples are then passed through a digital shaper 28 that produces a pulse shape that includes the detector, analog pulse processor, and digital shaper responses. In other words, this shape is a representation of the WF of the detector signal processing chain. Finally, the pulse height spectrum is accumulated by a pulse height analyzer 29.

The present invention is directed to the digital pulse shaper. A block diagram of the inventive digital pulse shaper is shown in FIG. 2. The configuration depicted represents a linear, time invariant digital filter. Therefore, the filter can be synthesized using two filter modules connected in series. The first module (Analog Response Deconvolution) 31 unfolds the known response of the analog pulse processor. For example, this could be a simple differentiator if the analog pulse processor response is a step function or this could be an exponential cancellation function, as described in V. T. Jordanov, *Nucl. Instr. and Meth.*, A351, pg. 592 (1994), if an exponential pulse is sampled.

If the analog response is removed (reduced to a very short pulse), then the digital pulse shaper can be synthesized by simply finding an impulse response that produces the weighting function (WF) shape. In other words, the main goal is to determine a filter with impulse response equal to the desired WF. Note that once the WF filter is constructed, it is possible to combine the analog response deconvolution function with the WF filter response in order to achieve more efficient algorithms.

The WF filter consists of two parallel chains. The first chain (chain "A") consists of a programmable digital delay line (DELAY-A) 33, a digital filter with adjustable rise/fall time and flattop (CONCAVE SHAPER) 34, and a digital multiplier MUL-A) 35. The second chain has functionally the same delay line (DELAY-B) 32 and a multiplier MUL-B) 37. The digital filter in CONVEX SHAPER 36 has similar controls as that in CONCAVE SHAPER 34, but differs in the impulse response. Both chains are fed by the output of the analog deconvolution unit (ADD) 39. The multipliers function as gain units while the delay lines provide means to align (relative delay) impulse responses of the filter chains. The order of the blocks in each of the chains has no influence on the overall response of the WF filter because each chain represents a linear, time-invariant filter. The output signals of the chains are summed together by the digital adder (ADD).

The key elements of the digital filter are the CONCAVE and CONVEX shapers. The CONCAVE and CONVEX shapers are characterized by their first and second derivatives of the pulse shape in the intervals of the rising and falling edge of the pulse shapes. For positive pulse shapes first derivatives are positive during the rising edge and negative during the falling edge of the pulse shape in both cases of CONCAVE and CONVEX shapers. The difference between the CONCAVE and CONVEX shapers is in the sign of the second derivative during the rising and falling edges of the pulse shape. For positive pulse shape the second derivative of the CONCAVE shaper is positive during both the rising and falling edges, while the second derivative of the CONVEX shaper is negative during the rising and falling edges. For negative pulse shapes the signs of the first and second derivative are inverted. Thus, CONCAVE and CONVEX shapers are defined as shapers that produce pulse shapes such that:

1) The sign of the first derivative of the CONCAVE pulse shape is the same as the sign of the first derivative of the CONVEX pulse shape during the interval of the rising edge of the pulse shapes—positive for positive pulse shapes and negative for negative pulse shapes.

2) The sign of the first derivative of the CONCAVE pulse shape is the same as the sign of the first derivative of the CONVEX pulse shape during the interval of the falling edge of the pulse shapes—negative for positive pulse shapes and positive for negative pulse shapes.

3) The sign of the second derivative of the CONCAVE pulse shape is opposite to the sign of the first derivative of the CONVEX pulse shape during the intervals of the rising and falling edges of the pulse shapes. The sign of the CONCAVE second derivative pulse shape is positive for positive pulse shapes and negative for negative pulse shapes for both the rising and failing edges of the pulse shapes.

FIG. 3 and FIG. 4 depict typical unit impulse responses of these shapers. The responses of the CONCAVE and CONVEX shapers are symmetrical with rise/fall time equal to $k_a$ and $k_b$ respectively. The adjustable flattop portions of the waveforms have durations of $m_a$ and $m_b$ respectively. Applying appropriate delays $d_a$ and $d_b$ (see FIG. 2), rise time and flattop settings and using a linear combination of these two shapes, various values of WF can be synthesized.

Consider the CONCAVE and CONVEX unit impulse responses ($h_a(j)$ and $h_b(j)$) to have a finite duration with rise and fall time that is described by a polynomial function. That is, in the discrete time domain, the impulse responses $h_a(j)$ and $h_b(j)$ can be expressed as:

Concave Shaper $$h_a(j) = \begin{cases} 0 & \text{for} \quad j \leq 0 \\ \sum_{K=0}^{N} a_K \cdot j^K & \text{for} \quad 0 < j < k_a \\ \sum_{K=0}^{N} a_K \cdot k_a^K & \text{for} \quad k_a \leq j \leq k_a + m_a \\ \sum_{K=0}^{N} a_K \cdot (2 \cdot k_a + m_a - j)^K & \text{for} \quad k_a + m_a < j < 2 \cdot k_a + m_a \\ 0 & \text{for} \quad j \geq 2 \cdot k_a + m_a \end{cases} \quad (1)$$

Convex Shaper $$h_b(j) = \begin{cases} 0 & \text{for} \quad j \leq 0 \\ \sum_{K=0}^{N} b_K \cdot j^K & \text{for} \quad 0 < j < k_b \\ \sum_{K=0}^{N} b_K \cdot k_b^K & \text{for} \quad k_b \leq j \leq k_b + m_b \\ \sum_{K=0}^{N} b_K \cdot (2 \cdot k_b + m_b - j)^K & \text{for} \quad k_b + m_b < j < 2 \cdot k_b + m_b \\ 0 & \text{for} \quad j \geq 2 \cdot k_b + m_b \end{cases} \quad (2)$$

It is also necessary that the first ($^1h_a(j)$ and $^1h_b(j)$) and second ($^2h_a(j)$ and $^2h_b(j)$) derivatives meet the following criteria:

$$^1h_a(j) = \begin{cases} > 0 & \text{for} \quad 0 < j < k_a \\ < 0 & \text{for} \quad k_a + m_a < j < 2 \cdot k_a + m_a \end{cases} \quad (3)$$

$$^2h_a(j) = \begin{cases} > 0 & \text{for} \quad 0 < j < k_a \\ > 0 & \text{for} \quad k_a + m_a < j < 2 \cdot k_a + m_a \end{cases}$$

-continued $$^1h_b(j) = \begin{cases} > 0 & \text{for} \quad 0 < j < k_b \\ < 0 & \text{for} \quad k_b + m_b < j < 2 \cdot k_b + m_b \end{cases} \quad (4)$$

$$^2h_b(j) = \begin{cases} < 0 & \text{for} \quad 0 < j < k_a \\ < 0 & \text{for} \quad k_b + m_b < j < 2 \cdot k_b + m_b \end{cases}$$

Equations 1 to 4 are generalized descriptions of the waveforms of FIG. 3 and FIG. 4. Second or third order polynomial functions may result in efficient, real time algorithms. These filters can be easily synthesized if first the desired impulse responses are differentiated numerically N+1 times. From equations (1) and (2) it can be found that the $^{N+1}h_a(j)$ and $^{N+1}h_b(j)$ are zero in the rising and falling portions of the impulse response. Therefore, the impulse responses $^{N+1}h_a(j)$ and $^{N+1}h_b(j)$ can be expressed as sum of unit impulse, delayed unit impulse, unit impulse derivatives and delayed unit impulse derivatives.

To illustrate the synthesis of CONCAVE and CONVEX impulse responses, consider a second order polynomial rise and fall time for both WFs:

$$h_a(j) = \begin{cases} 0 & \text{for} \quad j \leq 0 \\ \dfrac{j^2 + j}{2} & \text{for} \quad 0 < j < k_a \\ \dfrac{k_a \cdot (k_a + 1)}{2} & \text{for} \quad k_a \leq j \leq k_a + m_a \\ \dfrac{(2 \cdot k_a + m_a - j)^2 + (2 \cdot k_a + m_a - j)}{2} & \text{for} \quad k_a + m_a < j < 2 \cdot k_a + m_a \\ 0 & \text{for} \quad j \geq 2 \cdot k_a + m_a \end{cases} \quad (5)$$

$$h_b(j) = \begin{cases} 0 & \text{for} \quad j \leq 0 \\ \dfrac{(2 \cdot k_b + 1) \cdot j - j^2}{2} & \text{for} \quad 0 < j < k_b \\ \dfrac{k_b \cdot (k_b + 1)}{2} & \text{for} \quad k_b \leq j \leq k_b + m_b \\ \dfrac{(2 \cdot k_b + 1) + (2 \cdot k_b + m_b - j)(2 \cdot k_b + m_b - j)^2}{2} & \text{for} \quad k_b + m_b < j < 2 \cdot k_b + m_b \\ 0 & \text{for} \quad j \geq 2 \cdot k_b + m_b \end{cases} \quad (6)$$

FIG. 5 shows the unit impulse responses $h_a(j)$ and $h_b(j)$ for the case of $k_a = k_b$ and $m_a = m_b$. Both WFs reach the same maximum $$\dfrac{k_a \cdot (k_a + 1)}{2} = \dfrac{k_b \cdot (k_b + 1)}{2},$$

and the CONCAVE and CONVEX WFs have $2k_a + m_a - 1$ and $2k_b + m_b - 1$ nonzero values, respectively. Note also that the superposition of the responses depicted in FIG. 1 will result in trapezoidal WFs. The areas under the CONCAVE and CONVEX WF are:

$$AREA_a = \dfrac{k_a \cdot (k_a + 1) \cdot (k_a + 2)}{3} + \dfrac{k_a \cdot (k_a + 1) \cdot (m_a - 1)}{2}$$

$$AREA_b = k_b^2 \cdot (k_b + 1) - \dfrac{k_b \cdot (k_b + 1) \cdot (k_b - 1)}{3} + \dfrac{k_b \cdot (k_b + 1) \cdot (m_b - 1)}{2}$$

In order to synthesize these filters, find the first, second, and third numerical derivatives of the impulse responses $h_a(j)$ and $h_b(j)$.

$^1h_a(j) = h_a(j) - h_a(j-1); \quad {}^2h_a(j) = {}^1h_a(j) - {}^1h_a(j-1); \quad {}^3h_a(j) = {}^2h_a(j) - {}^2h_a(j-1);$ $^1h_b(j) = h_b(j) - h_b(j-1); \quad {}^2h_b(j) = {}^1h_b(j) - {}^1h_b(j-1); \quad {}^3h_b(j) = {}^2h_b(j) - {}^2h_b(j-1);$ FIG. 6 depicts $h_a(j)$ and $h_b(j)$ and the derivatives thereof as obtained from equation 7. It is important to notice that the third derivatives $^3h_a(j)$ and $^3h_b(j)$ have only 6 nonzero values at the points where the derivatives are not continuous. Table 1 and Table 2 summarize the weights of $^3h_a(j)$ and $^3h_b(j)$ respectively. Therefore, $^3h_a(j)$ and $^3h_b(j)$ can be expressed as sum of delayed and scaled unit impulses $\delta(j)$:

$$^3h_a(j) = \delta(j) - \delta(j - k_a)(k_a + 1) + \delta(j - k_a - 1)k_a - \delta(j - k_a - m_a)k_a + \quad (8)$$
$$\delta(j - k_a - m_a - 1)(k_a + 1) - \delta(j - 2k_a - m_a - 1)$$

$$^3h_a(j) = \delta(j)k_b - \delta(j - 1)(k_b + 1) + \delta(j - k_b - 1) - \delta(j - k_b - m_b) +$$
$$\delta(j - 2k_b - m_b)(k_b + 1) - \delta(j - 2k_b - m_b - 1)k_b$$

Equations 8 can be simplified in order to reduce the number of operations necessary to realize the CONCAVE and CONVEX WFs. The next step is to obtain the desired responses of the CONCAVE and CONVEX shapers. This is achieved by integrating numerically the impulse responses $^3h_a(j)$ and $^3h_b(j)$. Thus, the programmable CONCAVE and CONVEX shapers can be realized using three programmable delay lines (delay is a function of $k_a$ and $k_b$), one constant multiplier with programmable constant ($k_a$ and $k_b$), eight adder/subtractor units, and four or five registers (single clock delay). Block diagram realizations of the CONCAVE and CONVEX shapers are shown in FIG. 7 and FIG. 8, respectively.

Referring to FIG. 7, a real time digital CONCAVE shaper is illustrated generally by the reference numeral 100. Input samples $\delta(j)$ are applied to three units: DELAY LINE 101 with delay equal to ($k_a + m_a$) samples; DELAY LINE 102 with delay equal to $k_a$ samples and to the summing input of SUBTRACTOR 104. The output of DELAY LINE 101 is applied to one of the inputs of ADDER 103. The output of the DELAY LINE 102 is connected to the other input of ADDER 103 and to the subtracting input of SUBTRACTOR 104. The result of ADDER 103 is connected to the input of unit DELAY LINE 105 and to the summing input of SUBTRACTOR 107. The output of unit DELAY LINE 105 is applied to the subtracting input of SUBTRACTOR 107. The result of SUBTRACTOR 104 is connected to one of the inputs of ADDER 108 and to the input of DELAY LINE 106 with delay equal to ($k_a + m_a + 1$) samples. The output of DELAY LINE 106 is connected to the other input of ADDER 108. The result of ADDER 108 is applied to the summing input of SUBTRACTOR 110. The result of SUB- TRACTOR 107 is connected to the input of CONSTANT MULTIPLIER 109 with multiplication constant equal to $k_a$. The output of CONSTANT MULTIPLIER 109 is applied to the subtracting input of SUBTRACTOR 110. The output of SUBTRACTOR 110, $^3h_a(j)$ is the output of THIRD DERIVATIVE CONCAVE SHAPER 150.

The output of the THIRD DERIVATIVE CONCAVE SHAPER 150 is applied to the input of TRIPLE ACCUMULATION UNIT 180. The TRIPLE ACCUMULATION UNIT 180 incorporates three accumulators. The first accumulator consists of ADDER 111 and UNIT DELAY LINE 114. The input signal of TRIPLE ACCUMULATION UNIT 180 is applied to one of the inputs of ADDER 111, while the other input of ADDER 111 is connected to the output of UNIT DELAY LINE 114. The result node of ADDER 111 is connected to the input of UNIT DELAY LINE 114 and to the input of ADDER 112 that is a part of the second accumulator. The other input of ADDER 112 is connected to the output of UNIT DELAY LINE 115. The output of ADDER 112 is applied to the input of UNIT DELAY LINE 115 and one of the inputs of ADDER 113 that is a part of the third accumulator. The other input of ADDER 113 is connected to the output of UNIT DELAY LINE 116. The result of ADDER 113 is applied to the input of UNIT DELAY LINE 116 and the output of triple accumulation unit 180 that is the output $h_a(j)$ of the CONCAVE shaper 100.

CONCAVE shaper 100 operates by accepting the input samples $\delta(j)$ and passing them to DELAY LINE 101, DELAY LINE 102, and SUBTRACTOR 104. The delayed samples from DELAY LINE 101 and DELAY LINE 102 are summed by ADDER 103. The delayed samples from DELAY LINE 102 are subtracted from the input samples $\delta(j)$ by SUBTRACTOR 104. Further, the result from ADDER 103 is delayed one sample by UNIT DELAY LINE 105 and is subtracted from ADDER 103 result by the SUBTRACTOR 107. DELAY LINE 106 delays the result of SUBTRACTOR 104. The output of DELAY LINE 106 is added to the result from SUBTRACTOR 104. The result from the SUBTRACTOR 107 is multiplied by the CONSTANT MULTIPLIER 109 and then subtracted from the result of ADDER 108 by the SUBTRACTOR 110 resulting in the third derivative response $^3h_a(j)$. The third derivative is accumulated consecutively three times by the TRIPLE ACCUMULATION UNIT 180, resulting in the CONCAVE shaper unit impulse response $h_a(j)$.

Referring to FIG. 8, a real time digital CONVEX shaper is illustrated generally by the reference numeral 200. Input samples $\delta(j)$ are applied to DELAY LINE 201 with delay equal to $(2k_b+m_b)$ samples and DELAY LINE 202 with delay equal to $k_b$ samples. The input samples $\delta(j)$ are also applied to the summing input of SUBTRACTOR 204 and one of the inputs of ADDER 203. The output of DELAY LINE 201 is applied to the other input of ADDER 203. The output of DELAY LINE 202 is connected to the subtracting input of SUBTRACTOR 204. The result of ADDER 203 is connected to the input of UNIT DELAY LINE 205 and to the summing input of SUBTRACTOR 207. The output of UNIT DELAY LINE 205 is applied to the subtracting input of SUBTRACTOR 207. The result of SUBTRACTOR 204 is connected to the input of DELAY LINE 219 with delay equal to $(k_b+m_b)$ samples, and to the input of UNIT DELAY LINE 206. The output of DELAY LINE 219 is connected to one of the inputs of ADDER 208. The output of UNIT DELAY LINE 206 is connected to the other input of ADDER 208. The result of ADDER 208 is applied to the subtracting input of SUBTRACTOR 210. The result of SUBTRACTOR 207 is connected to the input of CONSTANT MULTIPLIER 209 with multiplication constant equal to $k_b$. The output of CONSTANT MULTIPLIER 209 is applied to the summing input of SUBTRACTOR 210. The output of SUBTRACTOR 210, $^3h_b(j)$, is the output of THIRD DERIVATIVE CONVEX SHAPER 250.

The output of THIRD DERIVATIVE CONVEX SHAPER 250 is applied to the input of TRIPLE ACCUMULATION UNIT 280. The output of TRIPLE ACCUMULATION UNIT 280 is the output $h_b(j)$ of the CONVEX shaper 200.

Shaper 200 operates by accepting input samples $\delta(j)$ and passing them to DELAY LINE 201, DELAY LINE 202, SUBTRACTOR 204, and ADDER 203. The delayed samples from DELAY LINE 201 and input samples $\delta(j)$ are summed by the ADDER 203. The delayed samples from DELAY LINE 202 are subtracted from the input samples $\delta(j)$ by SUBTRACTOR 204. The result from ADDER 203 is delayed one sample by UNIT DELAY LINE 205 and is subtracted from ADDER 203 result by the SUBTRACTOR 207. DELAY LINE 219 and UNIT DELAY LINE 206 delay the result of SUBTRACTOR 204. The output of UNIT DELAY LINE 206 is added to the output of DELAY LINE 219 by the ADDER 208. The result from the SUBTRACTOR 207 is multiplied by the CONSTANT MULTIPLIER 209. The result of the ADDER 208 is subtracted from the result of the CONSTANT MULTIPLIER 209 by the SUBTRACTOR 210, resulting in the third derivative response $^3h_b(j)$. The third derivative is accumulated consecutively three times by the TRIPLE ACCUMULATION UNIT 280 resulting in the shaper unit impulse response $h_b(j)$.

FIG. 9 illustrates a real time digital shaper with variable weighting function (WF), generally indicated by the reference numeral 1000. Input samples $x(j)$ are applied to DELAY LINE 1001 with delay equal to $d_a$ samples and DELAY LINE 1002 with delay equal to $d_b$ samples. The output of DELAY LINE 1001 is applied to the input of THIRD DERIVATIVE CONCAVE SHAPER 1100. The output of DELAY LINE 1002 is applied to the input of THIRD DERIVATIVE CONVEX SHAPER 1200. The output of THIRD DERIVATIVE CONCAVE SHAPER 1100 is applied to CONSTANT MULTIPLIER 1150. The output of THIRD DERIVATIVE CONVEX SHAPER 1200 is applied to CONSTANT MULTIPLIER 1250. The output of CONSTANT MULTIPLIER 1150 is connected to one input of ADDER 1300. The output of CONSTANT MULTIPLIER 1250 is connected to the other input of ADDER 1300. The output of ADDER 1300 is applied to the input of TRIPLE ACCUMULATION UNIT 1500. The output of TRIPLE ACCUMULATION UNIT 1500 is the output $y(j)$ of the real time digital shaper with variable weighting function.

The input samples are delayed by two delay lines 1001 and 1002. These delay lines are used to align the pulse shapes in order to achieve the desired weighting function (symmetrical or asymmetrical). Typically one of these delays, corresponding to the longer pulse shape, will be set to zero, while the other will align the shorter pulse shape in order to achieve a symmetrical weighting function. THIRD DERIVATIVE CONCAVE SHAPER and THIRD DERIVATIVE CONVEX SHAPER process the output samples of the delay lines 1001 and 1002 respectively. Two scaling CONSTANT MULTIPLIERS 1150 and 1250 follow the THIRD DERIVATIVE CONCAVE SHAPER and the THIRD DERIVATIVE CONVEX SHAPER, respectively. The multiplication constants A and B can be positive or negative. By choosing appropriate multiplication constants, one can adjust the shape of the weighting function. ADDER 1300 sums the results of the two multiplications. The TRIPLE ACCUMULATION UNIT is a common function in both CONCAVE and CONVEX shapers and was moved at the end as a single unit after the addition of the scaled third derivative responses.

When either of the DELAY LINES 1001 and 1002 is always set to zero, the practical realization of FIG. 9 may substitute one delay line and a multiplexer for both delay lines. In this case, the delayed discrete signal will be redirected either to the CONCAVE or to the CONVEX shaper, while the shaper that is not connected to the delay line will receive the non-delayed discrete signal. In order to achieve a symmetrical response it is necessary that:

$$d_a = 0, \text{ if } (2k_a + m_a) \geq (2k_b + m_b) \quad (9)$$
$$d_b = 0, \text{ if } (2k_a + m_a) \leq (2k_b + m_b)$$
$$d_b - d_a = \frac{(2k_a + m_a) - (2k_b + m_b)}{2}$$

One important feature of these shapers is the ability to adjust the flattop of the shaper. The flattop of the variable WF shaper depends only on the values $m_a$ and $m_b$. The duration of the flattop is the minimum of $m_a$ and $m_b$. FIGS. 10 through 15 illustrate some examples of various weighting functions with and without flattop that can be synthesized using CONCAVE and CONVEX shapers. The weighting functions are normalized to their maximal values. The responses illustrated in FIGS. 10 and 13 are similar to those described in E. Gatti and M. Smapietro, *Nucl. Inst. and Meth.*, A287, pg. 513 (1990) and the responses illustrated in FIG. 14 are similar to those described in E. Gatti et al., *Nucl. Instr. and Meth.*, A394, 268 (1997).

Weighting Function Synthesis Using Linear Interpolation

Equation 8 can be realized using a number of different arrangements. Depending on the available computational resources, one may choose to minimize the number of the adders or to minimize the number of delay units. For instance, the shaper of FIG. 9 can be rearranged so that only three types of delay lines are used $-z^{-k}$, $z^{-(k+m)}$, and $z^{-1}$, where k and m are the number of samples corresponding to the rise/fall time and the flattop. FIG. 16 depicts a block diagram realization using three types of delay lines.

Equations 5 and 6 indicate that the maximum of the unit impulse response of the CONCAVE and CONVEX shapers is proportional to the square of the rise/fall time of the WF. This filter gain may require significant computational resources (width of adders, accumulators, multipliers) when long rise time is selected. Besides, the complexity the power consumption also increases, which may be a limitation in portable instrumentation. In order to reduce the amplitude gain of the CONCAVE and CONVEX shapers a simple approach can be used, as described below.

Express the rise time and the fall time of the CONCAVE and CONVEX SHAPERS as:

$$k_a = N_a \cdot D$$
$$k_b = N_b \cdot D \quad (10)$$

where $N_a$, $N_b$ and D are integer numbers greater than zero. The rise/fall time can be divided into $N_a$, $N_b$ regions each containing D samples. We may now approximate the response given by Equations 1 and 2 with a function that is linear in each of the regions. As an illustration we will apply this technique to the shapes described by Equation 5 and 6. The slope of the approximation line element increases/decreases linearly. For instance, the rise time of the CONCAVE shaper for the $n^{th}$ segment of D samples ($h_a^n(j)$) can be expressed as:

$$h_a^n(j) = \frac{n \cdot (n-1) \cdot D}{2} + n \cdot j \text{ for } (n-1) \cdot D < j \leq n \cdot D; 0 < n \leq N_a \quad (11)$$

Using Equation 7 and the procedure described in the previous section, the impulse responses of both shapers can be obtained. Left columns of FIG. 17 and FIG. 18 show the result of applying Equation 7 for the case of N=10 and D=5. It is seen that the third derivative has quite a few non-zero weights. In order to reduce the number of the non-zero weights, a modified difference equation is used instead of the third derivative. Equation 7 can be modified as:

$$^1h_a(j)=h_a(j)-h_a(j-1); \; ^2h_a(j)=^1h_a(j)-^1h_a(j-1); \; ^{3D}h_a(j)=^2h_a(j-D); \quad (12)$$
$$^1h_b(j)=h_b(j)-h_b(j-1); \; ^2h_b(j)=^1h_b(j)-^1h_b(j-1); \; ^{3D}h_b(j)=^2h_b(j-D);$$

The result of applying Equation 12 is shown in the right columns of FIG. 17 and FIG. 18. As a result only six non zero values have to be combined in order to obtain $^{3D}h_a(j)$ and $^{3D}h_b(j)$. Table 3 and Table 4 summarize the non-zero values of these responses. Note that the maximal values of the CONCAVE and CONVEX shapers are $$\frac{k_a \cdot (N_a + 1)}{2}$$

and $$\frac{k_b \cdot (N_b + 1)}{2}.$$

Block diagrams of realizations of CONCAVE, CONVEX, and variable WF shapers are shown in FIG. 19, FIG. 20 and FIG. 21.

Note that shaper 300 in FIG. 19 is similar to shaper 100 (FIG. 7), except that: (1) delay line 305 has delay equal to D (unit delay line 105 in FIG. 7), (2) added delay line 316 with delay equal to D and changed the delay of 306 to $k_a+m_a$ (only one delay line 106 in FIG. 7), and (3) first accumulator in the triple accumulator unit has delay equal to D (delay of 1 in FIG. 7). Shaper 400 in FIG. 20 is similar to shaper 200 (FIG. 8), except that: (1) delay lines 401 and 402 have a different arrangement, (2) delay lines 405 and 406 have delays equal to D, and (3) first accumulator in the triple accumulator unit has delay equal to D. Shaper 2000 in FIG. 21 is similar to shaper 1000 (FIG. 9), except that: (1) the third derivative shapers are from shapers 300 (FIG. 19) and 400 (FIG. 20) and (2) the triple accumulator unit has delar equal to D. Shaper 2000 is more general because it reduces to shapers 100 (FIG. 7), 200 (FIG. 8), and 1000 (FIG. 9) when the delay value D=1.

Note also that the shaper in FIG. 21 is equivalent to the shaper of FIG. 16 when D=1. FIG. 22 shows a case when the analog response deconvolution is part of the integration chain of the shaper. The CONCAVE and CONVEX shapers directly process the input sampled signal. The deconvolution of the exponential component is actually embedded in an integration block that converts exponential pulse to a step function (see V. T. Jordanov et al., Nucl. Instr. and Meth., A353, pg. 261 (1994) and V. T. Jordanov, Nucl. Instr. and Meth., A351, pg. 592 (1994). By combining these responses, an efficient arrangement of the variable WF shaper is achieved.

TABLE 1

Non-zero values of the third derivative ${}^3h_a(j)$ of the CONCAVE impulse response $h_a(j)$.

| $j$ | ${}^3h_a(j)$ |
| --- | --- |
| 0 | 1 |
| $k_a$ | $-(k_a + 1)$ |
| $k_a + 1$ | $k_a$ |
| $k_a + m_a$ | $-k_a$ |
| $k_a + m_a + 1$ | $k_a + 1$ |
| $2k_a + m_a + 1$ | $-1$ |

TABLE 2

Non-zero values of the third derivative ${}^3h_b(j)$ of the CONVEX impulse response $h_b(j)$

| $j$ | ${}^3h_b(j)$ |
| --- | --- |
| 0 | $k_b$ |
| 1 | $-(k_b + 1)$ |
| $k_b + 1$ | 1 |
| $k_b + m_b$ | $-1$ |
| $2k_b + m_b$ | $k_b + 1$ |
| $2k_b + m_b + 1$ | $-k_b$ |

TABLE 3

Non-zero values of the third derivative ${}^3h_a(j)$ of the CONCAVE impulse response $h_a(j)$ of interpolating shaper with interpolating segment length equal to D samples.

| $j$ | ${}^3h_a(j)$ |
| --- | --- |
| 0 | 1 |
| $k_a$ | $-(N_a + 1)$ |
| $k_a + D$ | $N_a$ |
| $k_a + m_a$ | $-N_a$ |
| $k_a + m_a + D$ | $N_a + 1$ |
| $2k_a + m_a + D$ | $-1$ |

TABLE 4

Non-zero values of the third derivative ${}^3h_b(j)$ of the CONVEX impulse response $h_b(j)$ of interpolating shaper with interpolating segment length equal to D samples.

| $j$ | ${}^3h_b(j)$ |
| --- | --- |
| 0 | $N_b$ |
| $D$ | $-(N_b + 1)$ |
| $k_b + D$ | 1 |
| $k_b + m_b$ | $-1$ |
| $2k_b + m_b$ | $N_b + 1$ |
| $2k_b + m_b + D$ | $-N_b$ |

What is claimed is:

1. A method of providing real time digital pulse shaping, comprising:

(a) receiving a digitized pulse signal from a radiation detector;

(b) applying said digitized pulse signal to first and second processing channels, said first processing channel including a digitally synthesizing CONCAVE shaper and said second processing channel including a digitally synthesizing CONVEX shaper;

(c) applying selected digital control parameters to said digitally synthesizing CONCAVE shaper and said digitally synthesizing CONVEX shaper to produce desired first and second weighting functions; and (d) superposing said first and second weighting functions to produce a desired overall weighting function.

* * * * *